(12) United States Patent
Lin et al.

(10) Patent No.: US 12,183,823 B2
(45) Date of Patent: Dec. 31, 2024

(54) FIN FIELD-EFFECT TRANSISTOR WITH A GATE STRUCTURE HAVING A DIELECTRIC PROTECTION LAYER

(71) Applicant: Taiwan Semiconductor Manufacturing Company, Ltd., Hsinchu (TW)

(72) Inventors: Chun-Neng Lin, Hsinchu County (TW); Jian-Jou Lian, Tainan (TW); Ming-Hsi Yeh, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 37 days.

(21) Appl. No.: 17/868,999

(22) Filed: Jul. 20, 2022

(65) Prior Publication Data

US 2022/0359743 A1 Nov. 10, 2022

Related U.S. Application Data

(62) Division of application No. 16/901,680, filed on Jun. 15, 2020, now Pat. No. 11,749,753.

(51) Int. Cl.
*H01L 29/78* (2006.01)
*H01L 21/28* (2006.01)
(Continued)

(52) U.S. Cl.
CPC ...... *H01L 29/785* (2013.01); *H01L 21/28247* (2013.01); *H01L 21/823431* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 10,164,053 B1 * 12/2018 Chung .............. H01L 29/66795
10,211,103 B1    2/2019 Huang et al.
(Continued)

FOREIGN PATENT DOCUMENTS

CN    109860055 A    6/2019
CN    110783270 A    2/2020
(Continued)

OTHER PUBLICATIONS

Final Office Action on U.S. Appl. No. 16/901,680 dtd May 12, 2022.
US Office Action on U.S. Appl. No. 16/901,680 dtd Jan. 3, 2022.
Office Action issued in connection with Chinese Appl. No. 202110390184.7 dated Sep. 6, 2024.

*Primary Examiner* — Younes Boulghassoul
(74) *Attorney, Agent, or Firm* — FOLEY & LARDNER LLP

(57) ABSTRACT

A semiconductor device includes a semiconductor fin. The semiconductor device includes a gate spacer over the semiconductor fin. A lower portion of the gate spacer surrounds a first region and an upper portion of the gate spacer surrounds a second region. The semiconductor device includes a gate dielectric within the first region. The semiconductor device includes a metal gate within the first region. The semiconductor device includes a dielectric protection layer, in contact with the gate dielectric layer, that includes a first portion within the second region and a second portion lining a top surface of the metal gate.

20 Claims, 17 Drawing Sheets

(51) Int. Cl.
   *H01L 21/8234*   (2006.01)
   *H01L 29/40*   (2006.01)
   *H01L 29/417*   (2006.01)
   *H01L 29/423*   (2006.01)
   *H01L 29/66*   (2006.01)
   *H01L 21/768*   (2006.01)

(52) U.S. Cl.
   CPC .... *H01L 21/823437* (2013.01); *H01L 29/401* (2013.01); *H01L 29/41791* (2013.01); *H01L 29/4236* (2013.01); *H01L 29/66545* (2013.01); *H01L 29/66795* (2013.01); *H01L 29/7834* (2013.01); *H01L 21/76819* (2013.01); *H01L 29/6656* (2013.01)

(58) Field of Classification Search
   CPC ........... H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 29/42376; H01L 29/42384; H01L 21/28114; H01L 21/823437; H01L 21/823828; H01L 21/823456; H01L 21/82385; H01L 29/66545; H01L 21/28247; H01L 21/76829; H01L 21/76832; H01L 21/76834; H01L 21/02362; H01L 29/511–513; H01L 29/518; H01L 29/42356–42364

See application file for complete search history.

(56) References Cited

U.S. PATENT DOCUMENTS

| | | | |
|---|---|---|---|
| 2012/0064687 A1* | 3/2012 | Kondo | H01L 29/66545 438/303 |
| 2016/0020294 A1* | 1/2016 | Koo | H01L 21/76832 257/288 |
| 2016/0284641 A1* | 9/2016 | Liou | H01L 23/5226 |
| 2016/0307758 A1* | 10/2016 | Li | H01L 21/02167 |
| 2016/0322471 A1* | 11/2016 | JangJian | H01L 21/823842 |
| 2017/0256444 A1 | 9/2017 | Chang et al. | |
| 2018/0083002 A1 | 3/2018 | Kim et al. | |
| 2019/0148522 A1* | 5/2019 | Wu | H01L 21/28556 257/365 |
| 2019/0165114 A1* | 5/2019 | Lee | H01L 21/823475 |
| 2019/0333812 A1 | 10/2019 | Seong et al. | |
| 2020/0058553 A1 | 2/2020 | Lim et al. | |
| 2020/0105672 A1* | 4/2020 | Madhavan | H01L 21/31116 |
| 2020/0105931 A1* | 4/2020 | Wu | H01L 29/66795 |
| 2020/0135871 A1* | 4/2020 | Tsai | H01L 29/41766 |
| 2020/0152509 A1 | 5/2020 | Greene et al. | |
| 2020/0335602 A1* | 10/2020 | Chu | H01L 29/4966 |

FOREIGN PATENT DOCUMENTS

| | | |
|---|---|---|
| EP | 3 570 317 A1 | 11/2019 |
| TW | I559542 B | 11/2016 |
| TW | 201914033 A | 4/2019 |
| TW | I679704 B | 12/2019 |
| TW | 202002089 A | 1/2020 |
| TW | 202016999 A | 5/2020 |

* cited by examiner

FIN FIELD-EFFECT TRANSISTOR WITH A GATE STRUCTURE HAVING A DIELECTRIC PROTECTION LAYER

CROSS-REFERENCE TO RELATED APPLICATIONS

The present application is a divisional of U.S. Non-Provisional patent application Ser. No. 16/901,680, filed on Jun. 15, 2020, and titled "Fin Field-Effect Transistor and Method of Forming the Same," the entire disclosure of which is incorporated herein by reference.

BACKGROUND

The present disclosure generally relates to semiconductor devices, and particularly to methods of making a non-planar transistor.

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

Fin Field-Effect Transistor (FinFET) devices are becoming commonly used in integrated circuits. FinFET devices have a three-dimensional structure that comprises a fin protruding from a substrate. A gate structure, configured to control the flow of charge carriers within a conductive channel of the FinFET device, wraps around the fin. For example, in a tri-gate FinFET device, the gate structure wraps around three sides of the fin, thereby forming conductive channels on three sides of the fin.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
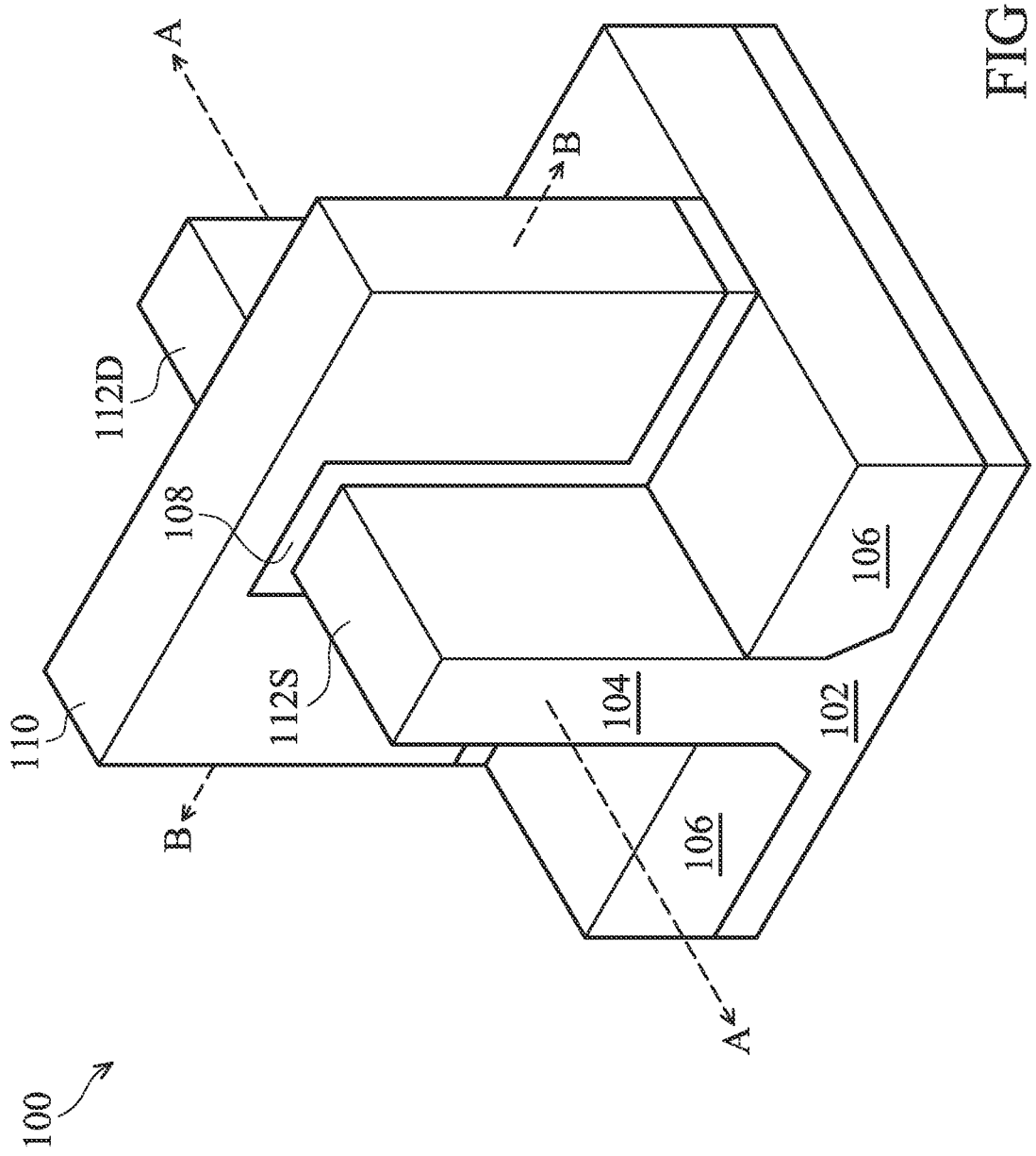
FIG. 1 illustrates a perspective view of a Fin Field-Effect Transistor (FinFET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about" and "substantially" can indicate a value of a given quantity that varies within 5% of the value (e.g., ±1%, ±2%, ±3%, ±4%, ±5% of the value).

Embodiments of the present disclosure are discussed in the context of forming a FinFET device, and in particular, in the context of forming contacts for a FinFET device. In some embodiments, a dummy gate structure is formed over a fin. After a gate spacer is formed around the dummy gate structure, source/drain regions are formed on respective sides of the gate spacer. Next, an interlayer dielectric (ILD) layer is formed over the source/drain regions, and the dummy gate structure is removed to form a gate trench in the ILD layer. Next, an active gate structure is formed in a lower portion of the gate trench. Next, a dielectric protection layer is formed over the gate trench to overlay a top surface of the active gate structure and at least partially extend along inner sidewalls of an upper portion of the gate trench. Next, a (gate) contact is formed to penetrate through the portion of the dielectric protection layer on the top surface of the active gate structure so as to electrically connect to the active gate structure.

Gate contacts for FinFET devices formed by the above described method may be less subjected to short-circuit (or bridged) issues. As the dimensions of technology nodes continues to shrink, the distance between adjacent device features of an integrated circuit may become significantly shorter. As such, forming corresponding contacts (e.g., via structures) to couple the device features may become challenging. For example, the contacts for adjacent device features, which should have been electrically isolated from each other, may be inadvertently bridged. This may be due to the increasingly shrunken distance between adjacent device features, which results in a thinner, or more penetrable, dielectric layer (e.g., an ILD layer) formed between the corresponding contacts for the device features. By forming the dielectric protection layer, as disclosed herein, the contact can be better isolated from adjacent contacts. Thus, even though the ILD layer between two adjacent contacts becomes thinner or inadvertently penetrated (by a conductive material), the disclosed dielectric protection layer can assure that the two adjacent contacts stay electrically separated from each other, as they should be.

FIG. 1 illustrates a perspective view of an example FinFET device 100, in accordance with various embodiments. The FinFET device 100 includes a substrate 102 and a fin 104 protruding above the substrate 102. Isolation regions 106 are formed on opposing sides of the fin 104, with the fin 104 protruding above the isolation regions 106. A gate dielectric 108 is along sidewalls and over a top surface of the fin 104, and a gate 110 is over the gate dielectric 108. Source/drain regions 112S and 112D are in (or extended from) the fin 104 and on opposing sides of the gate dielectric 108 and the gate 110. FIG. 1 is provided as a reference to illustrate a number of cross-sections in subsequent figures. For example, cross-section B-B extends along a longitudinal axis of the gate 110 of the FinFET device 100. Cross-section A-A is perpendicular to cross-section B-B and is along a longitudinal axis of the fin 104 and in a direction of, for example, a current flow between the source/drain regions, 112S and 112D. Subsequent figures refer to these reference cross-sections for clarity.

Figure 2:
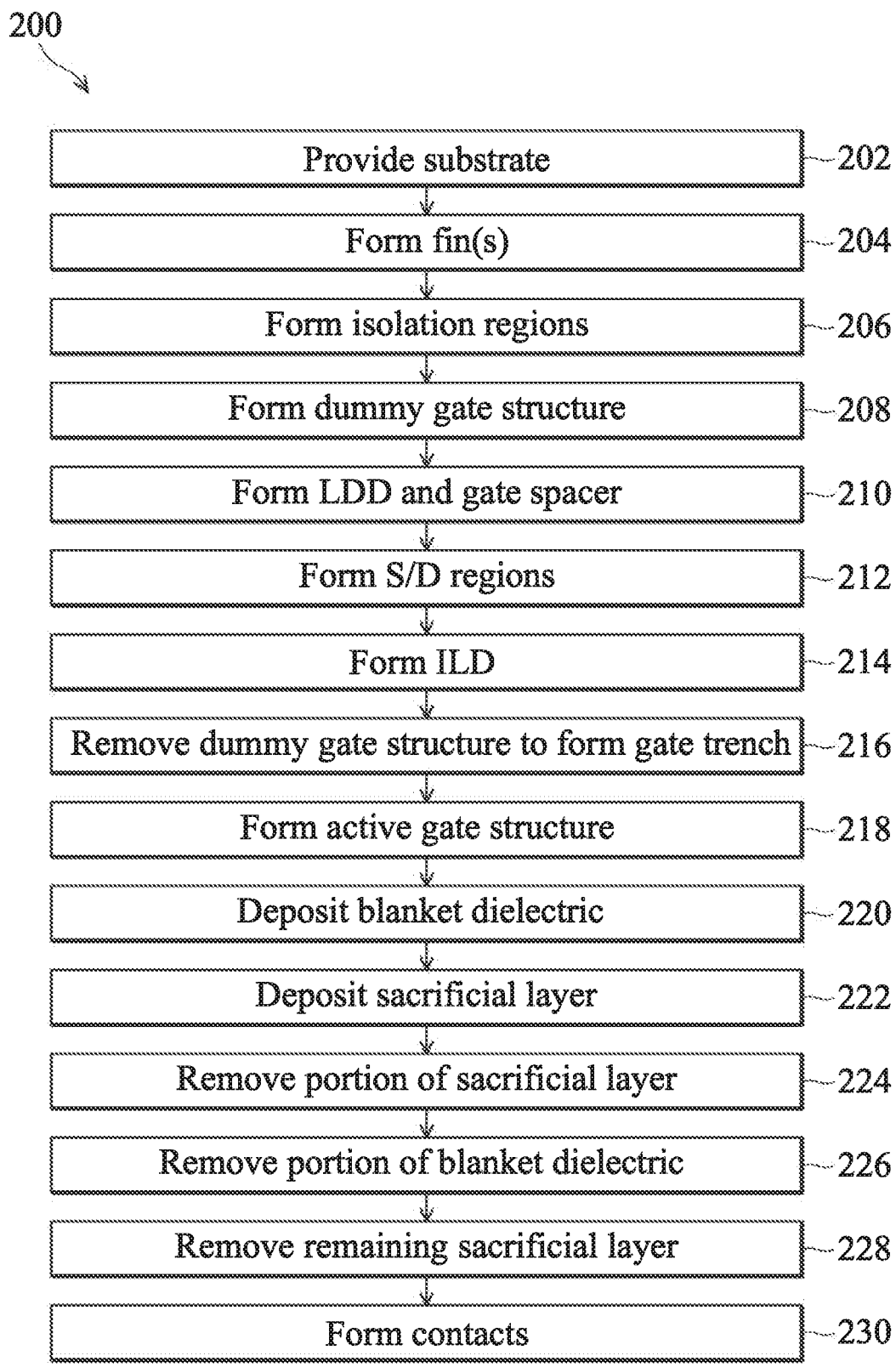
FIG. 2 illustrates a flow chart of an example method for making a non-planar transistor device, in accordance with some embodiments.

FIG. 2 illustrates a flowchart of a method 200 to form a non-planar transistor device, according to one or more embodiments of the present disclosure. For example, at least some of the operations of the method 200 can be used to form a FinFET device (e.g., FinFET device 100), a nanosheet transistor device, a nanowire transistor device, a vertical transistor, or the like. It is noted that the method 200 is merely an example, and is not intended to limit the present disclosure. Accordingly, it is understood that additional operations may be provided before, during, and after the method 200 of FIG. 2, and that some other operations may only be briefly described herein. In some embodiments, operations of the method 200 may be associated with cross-sectional views of an example FinFET device at various fabrication stages as shown in FIGS. 3, 4, 5, 6, 7, 8, 9, 10, 11, 12, 13, 14, 15, 16, and 17, respectively, which will be discussed in further detail below.

In brief overview, the method 200 starts with operation 202 of providing a substrate. The method 200 continues to operation 204 of forming one or more fins. The method 200 continues to operation 206 of forming isolation regions. The method 200 continues to operation 208 of forming dummy gate structures. The method 200 continues to operation 210 of forming lightly doped drain (LDD) regions and one or more gate spacers. The method 200 continues to operation 212 of growing source/drain regions. The method 200 continues to operation 214 of forming an interlayer dielectric (ILD). The method 200 continues to operation 216 of removing the dummy gate structure. Upon the dummy gate structure being removed, a gate trench is formed. The method 200 continues to operation 218 of forming an active gate structure. The active gate structure may be disposed in a lower portion of the gate trench. The method 200 continues to operation 220 of depositing a blanket dielectric. The method 200 continues to operation 222 of depositing a sacrificial layer over the blanket dielectric. The method 200 continues to operation 224 of removing a portion of the sacrificial layer. The method 200 continues to operation 226 of removing a portion of the blanket dielectric. The method 200 continues to operation 228 of removing the remaining portion of the sacrificial layer. The method 200 continues to operation 230 of forming at least one contact for each of the active gate structure and the source/drain regions.

As mentioned above, FIGS. 3-17 each illustrate, in a cross-sectional view, a portion of a FinFET device 300 at various fabrication stages of the method 200 of FIG. 2. The FinFET device 300 is substantially similar to the FinFET device 100 shown in FIG. 1, but with multiple gate structures and multiple fins. For example, FIGS. 3-6 illustrate cross-sectional views of the FinFET device 300 along cross-section B-B (as indicated in FIG. 1); and FIG. 7-17 illustrate cross-sectional views of the FinFET device 300 along cross-section A-A (as indicated in FIG. 1). Although FIGS. 3-17 illustrate the FinFET device 300, it is understood the FinFET device 300 may include a number of other devices such as inductors, fuses, capacitors, coils, etc., which are not shown in FIGS. 3-17, for purposes of clarity of illustration.

Figure 3:
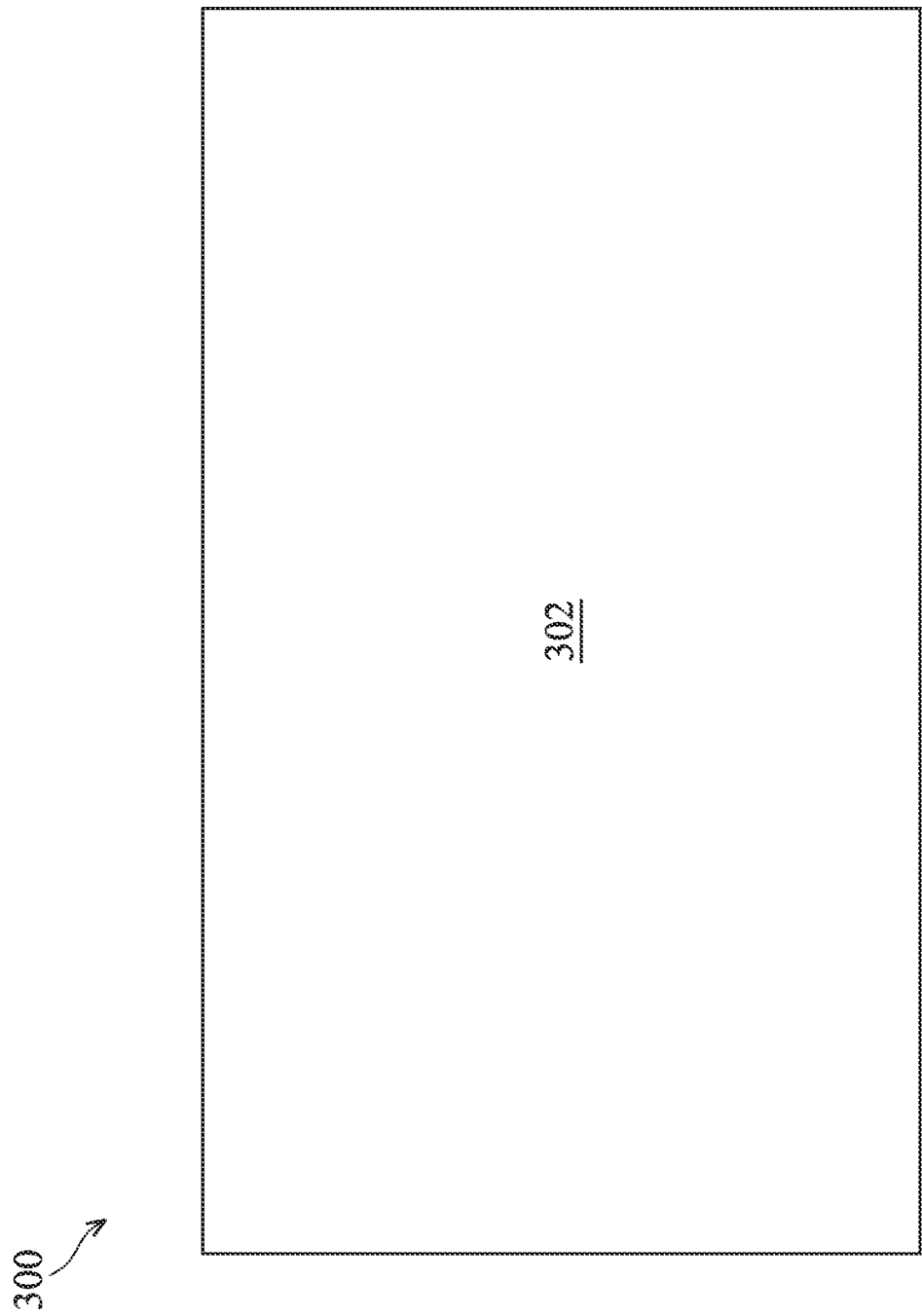
FIGS. 3, 4, 5, 6, 7, 8, 9, 10, 11, 12, 13, 14, 15, 16, and 17 illustrate cross-sectional views of an example FinFET device during various fabrication stages, made by the method of FIG. 2, in accordance with some embodiments.

Corresponding to operation 202 of FIG. 2, FIG. 3 is a cross-sectional view of the FinFET device 300 including a semiconductor substrate 302 at one of the various stages of fabrication. The substrate 302 may be a semiconductor substrate, such as a bulk semiconductor, a semiconductor-on-insulator (SOI) substrate, or the like, which may be doped (e.g., with a p-type or an n-type dopant) or undoped. The substrate 302 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 302 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 4:
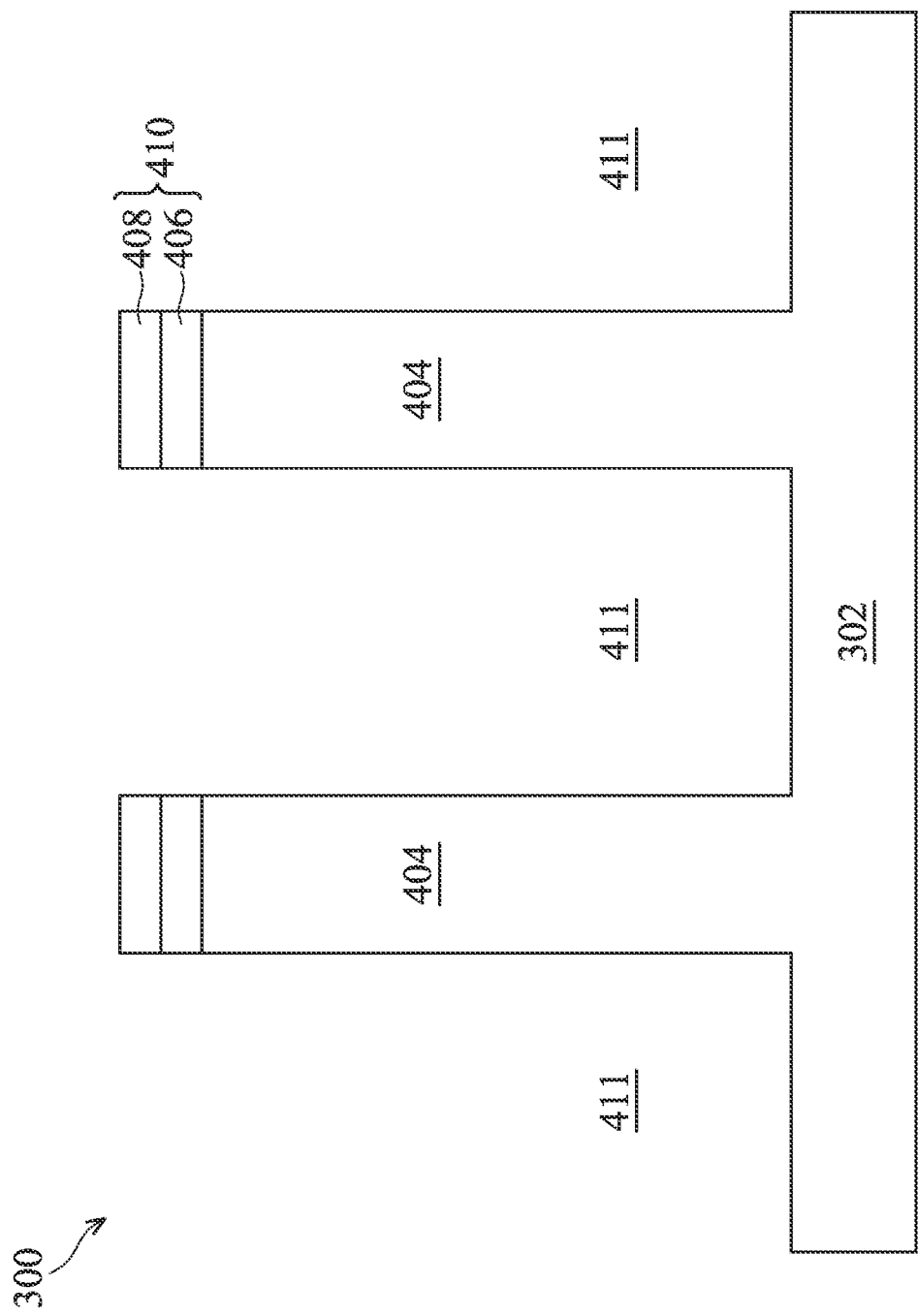

Corresponding to operation 204 of FIG. 2, FIG. 4 is a cross-sectional view of the FinFET device 300 including (semiconductor) fins 404 at one of the various stages of fabrication. Although one fin is shown in the illustrated embodiment of FIG. 4 (and the following figures), it should be appreciated that the FinFET device 300 can include any number of fins while remaining within the scope of the present disclosure. In some embodiments, the fins 404 are formed by patterning the substrate 302 using, for example, photolithography and etching techniques. For example, a mask layer, such as a pad oxide layer 406 and an overlying pad nitride layer 408, is formed over the substrate 302. The pad oxide layer 406 may be a thin film comprising silicon oxide formed, for example, using a thermal oxidation process. The pad oxide layer 406 may act as an adhesion layer between the substrate 302 and the overlying pad nitride layer 408. In some embodiments, the pad nitride layer 408 is formed of silicon nitride, silicon oxynitride, silicon carbonitride, the like, or combinations thereof. The pad nitride layer 408 may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer 406 and pad nitride layer 408 to form a patterned mask 410, as illustrated in FIG. 4.

The patterned mask 410 is subsequently used to pattern exposed portions of the substrate 302 to form trenches (or openings) 411, thereby defining fins 404, each of which is between two adjacent trenches 411, as illustrated in FIG. 4. In some embodiments, the fins 404 are formed by etching trenches in the substrate 302 using, for example, reactive ion etch (RIE), neutral beam etch (NBE), the like, or combinations thereof. The etch may be anisotropic. In some embodiments, the trenches 411 may be strips (viewed from the top) parallel to each other, and closely spaced with respect to each other. In some embodiments, the trenches 411 may be continuous and surround the corresponding one of the fins 404. The fins 404 may sometimes be referred to as fin 404 hereinafter.

The fin 404 may be patterned by any suitable method. For example, the fin 404 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fin.

Figure 5:
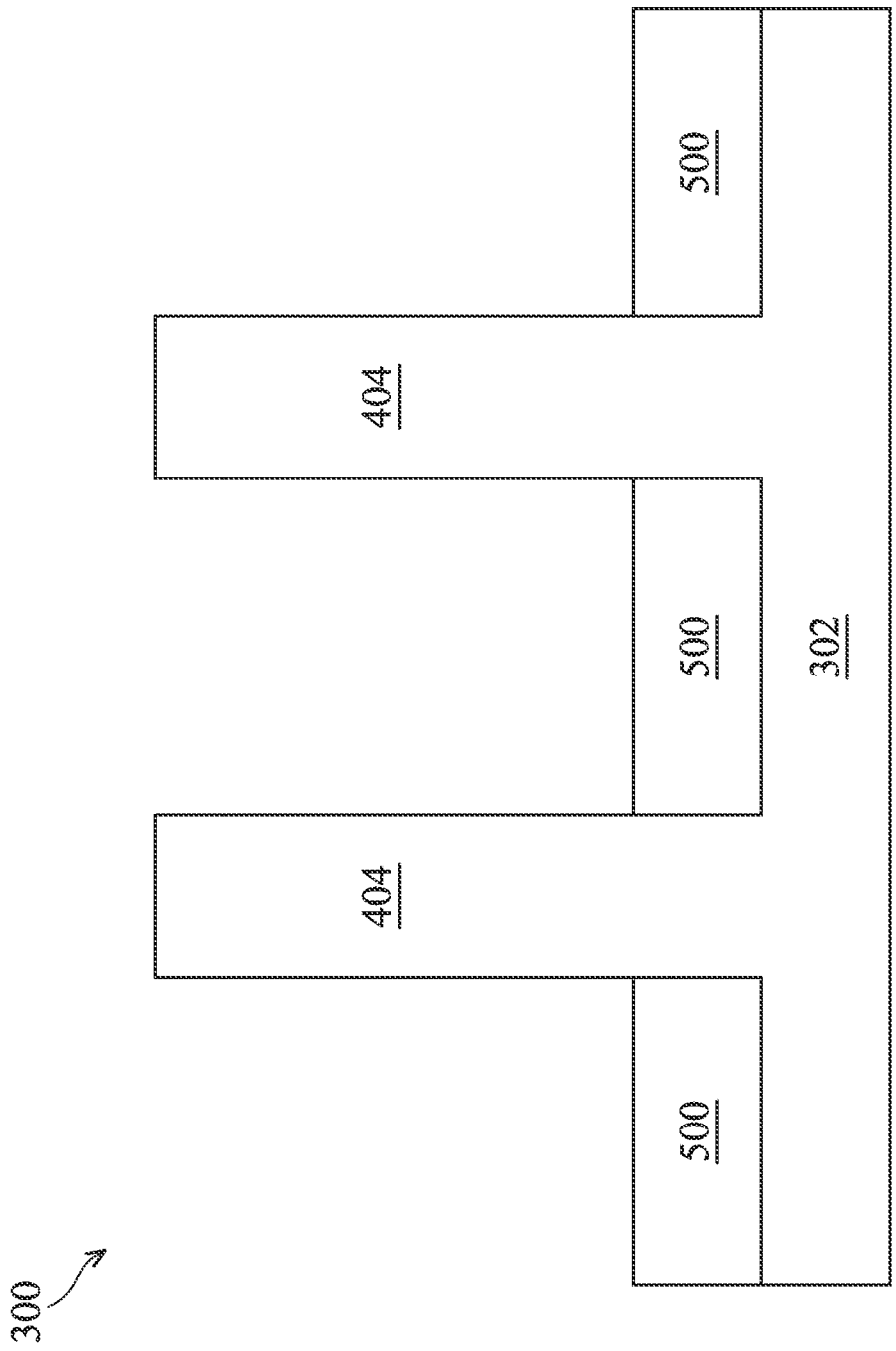

Corresponding to operation 206 of FIG. 2, FIG. 5 is a cross-sectional view of the FinFET device 300 including isolation regions 500 at one of the various stages of fabrication. The isolation regions 500, which are formed of an insulation material, can electrically isolate neighboring fins from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In the illustrated embodiment, the insulation material is silicon oxide formed by a FCVD process. An anneal process may be performed once the insulation material is formed. A planarization process, such as a chemical mechanical polish (CMP), may remove any excess insulation material and form top surfaces of the isolation regions 500 and a top surface of the fin 404 that are coplanar (not shown). The patterned mask 410 (FIG. 4) may also be removed by the planarization process.

In some embodiments, the isolation regions 500 include a liner, e.g., a liner oxide (not shown), at the interface between each of the isolation regions 500 and the substrate 302 (fin 404). In some embodiments, the liner oxide is formed to reduce crystalline defects at the interface between the substrate 302 and the isolation region 500. Similarly, the liner oxide may also be used to reduce crystalline defects at the interface between the fin 404 and the isolation region 500. The liner oxide (e.g., silicon oxide) may be a thermal oxide formed through a thermal oxidation of a surface layer of the substrate 302, although other suitable method may also be used to form the liner oxide.

Next, the isolation regions 500 are recessed to form shallow trench isolation (STI) regions 500, as shown in FIG. 5. The isolation regions 500 are recessed such that the upper portions of the fin 404 protrude from between neighboring STI regions 500. Respective top surfaces of the STI regions 500 may have a flat surface (as illustrated), a convex surface, a concave surface (such as dishing), or combinations thereof. The top surfaces of the STI regions 500 may be formed flat, convex, and/or concave by an appropriate etch. The isolation regions 500 may be recessed using an acceptable etching process, such as one that is selective to the material of the isolation regions 500. For example, a dry etch or a wet etch using dilute hydrofluoric (DHF) acid may be performed to recess the isolation regions 500.

FIGS. 3 through 5 illustrate an embodiment of forming one or more fins (e.g., 404), but a fin may be formed in various different processes. For example, a top portion of the substrate 302 may be replaced by a suitable material, such as an epitaxial material suitable for an intended type (e.g., N-type or P-type) of semiconductor devices to be formed. Thereafter, the substrate 302, with epitaxial material on top, is patterned to form the fin 404 that includes the epitaxial material.

As another example, a dielectric layer can be formed over a top surface of a substrate; trenches can be etched through the dielectric layer; homoepitaxial structures can be epitaxially grown in the trenches; and the dielectric layer can be recessed such that the homoepitaxial structures protrude from the dielectric layer to form one or more fins.

In yet another example, a dielectric layer can be formed over a top surface of a substrate; trenches can be etched through the dielectric layer; heteroepitaxial structures can be epitaxially grown in the trenches using a material different from the substrate; and the dielectric layer can be recessed such that the heteroepitaxial structures protrude from the dielectric layer to form one or more fins.

In embodiments where epitaxial material(s) or epitaxial structures (e.g., the heteroepitaxial structures or the homoepitaxial structures) are grown, the grown material(s) or structures may be in situ doped during growth, which may obviate prior and subsequent implantations although in situ and implantation doping may be used together. Still further, it may be advantageous to epitaxially grow a material in an NMOS region different from the material in a PMOS region. In various embodiments, the fin 404 may include silicon germanium ($Si_xGe_{1-x}$, where x can be between 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6:
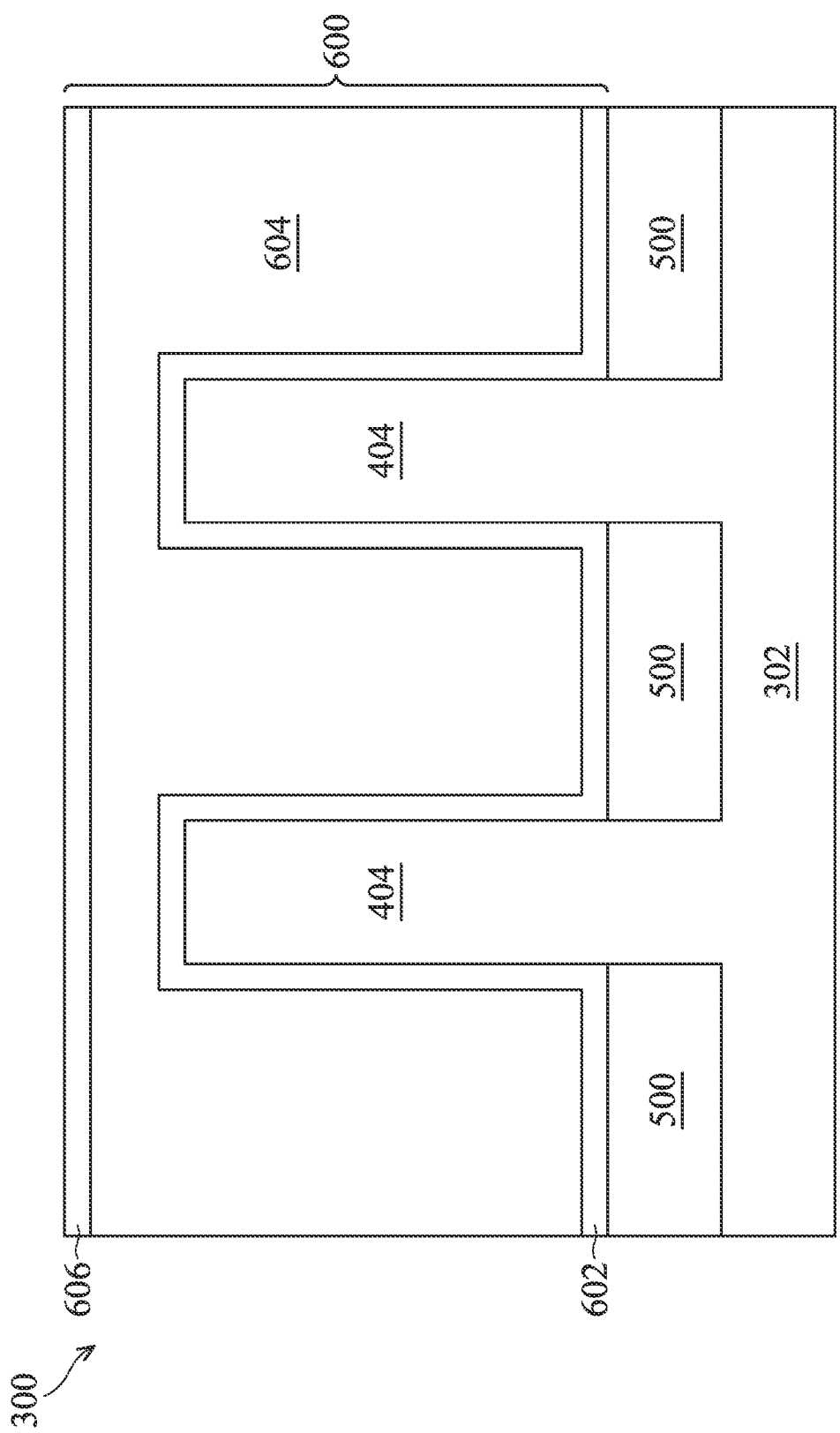

Corresponding to operation 208 of FIG. 2, FIG. 6 is a cross-sectional view of the FinFET device 300 including a dummy gate structure 600 at one of the various stages of fabrication. The dummy gate structure 600 includes a dummy gate dielectric 602 and a dummy gate 604, in some embodiments. A mask 606 may be formed over the dummy gate structure 600. To form the dummy gate structure 600, a dielectric layer is formed on the fin 404. The dielectric layer may be, for example, silicon oxide, silicon nitride, multilayers thereof, or the like, and may be deposited or thermally grown.

A gate layer is formed over the dielectric layer, and a mask layer is formed over the gate layer. The gate layer may be deposited over the dielectric layer and then planarized, such as by a CMP. The mask layer may be deposited over the gate layer. The gate layer may be formed of, for example, polysilicon, although other materials may also be used. The mask layer may be formed of, for example, silicon nitride or the like.

After the layers (e.g., the dielectric layer, the gate layer, and the mask layer) are formed, the mask layer may be patterned using acceptable photolithography and etching techniques to form the mask 606. The pattern of the mask 606 then may be transferred to the gate layer and the dielectric layer by an acceptable etching technique to form the dummy gate 604 and the underlying dummy gate dielectric 602, respectively. The dummy gate 604 and the dummy gate dielectric 602 cover a portion (e.g., a channel region) of the fin 404. The dummy gate 604 may also have a lengthwise direction (e.g., direction B-B of FIG. 1) substantially perpendicular to the lengthwise direction (e.g., direction of A-A of FIG. 1) of the fin 404.

The dummy gate dielectric 602 is shown to be formed over the fin 404 (e.g., over top surfaces and sidewalls of the fin 404) and over the STI regions 500 in the example of FIG. 6. In other embodiments, the dummy gate dielectric 602 may be formed by, e.g., thermal oxidization of a material of the fin 404, and therefore, may be formed over the fin 404 but not over the STI regions 500. It should be appreciated that these and other variations are still included within the scope of the present disclosure.

FIGS. 7-17 illustrate the cross-sectional views of further processing (or making) of the FinFET device 300 along cross-section A-A (along a longitudinal axis of the fin), as shown in FIG. 1. In brief overview, two dummy gate structures 600A and 600B are illustrated over the fin 404 in the examples of FIGS. 7-17. For simplicity, the dummy gate structures 600A and 600B may sometimes be collectively referred to as dummy gate structures 600. It should be appreciated that more or less than three dummy gate structures can be formed over the fin 404, while remaining within the scope of the present disclosure.

Figure 7:
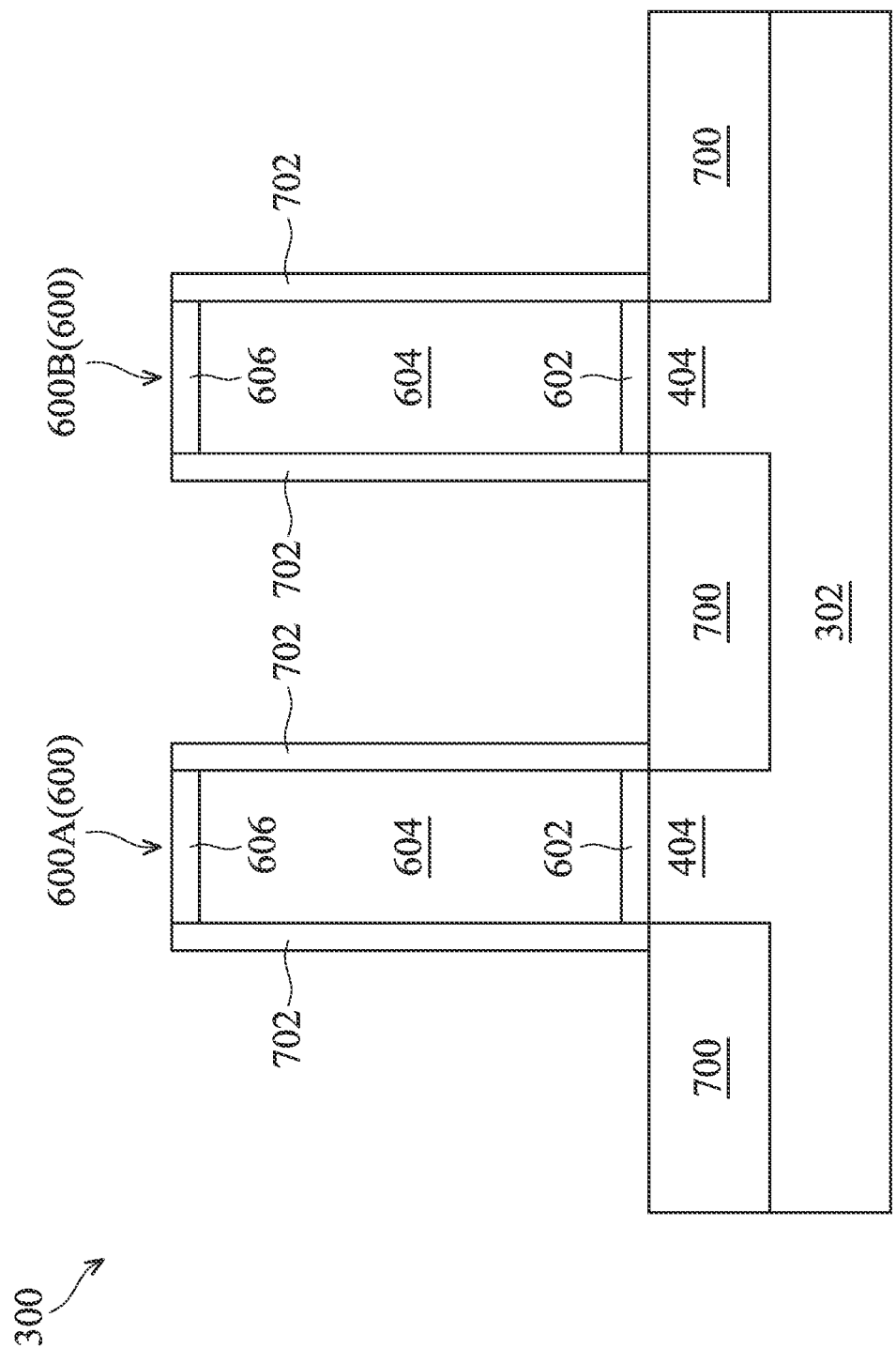

Corresponding to operation 210 of FIG. 2, FIG. 7 is a cross-sectional view of the FinFET device 300 including a number of lightly doped drain (LDD) regions 700 formed in the fin 404 at one of the various stages of fabrication. The LDD regions 700 may be formed by a plasma doping process. The plasma doping process may include forming and patterning masks such as a photoresist to cover the regions of the FinFET device 300 that are to be protected from the plasma doping process. The plasma doping process may implant N-type or P-type impurities in the fin 404 to form the LDD regions 700. For example, P-type impurities, such as boron, may be implanted in the fin 404 to form the LDD regions 700 for a P-type device. In another example, N-type impurities, such as phosphorus, may be implanted in the fin 404 to form the LDD regions 700 for an N-type device. In some embodiments, the LDD regions 700 abut one of the channel regions of the FinFET device 300 (e.g., the portion of the fin 404 overlaid by one of the dummy structures 600). Portions of the LDD regions 700 may extend under the dummy gate structure 600 and into the channel region of the FinFET device 300. FIG. 7 illustrates a non-limiting example of the LDD regions 700. Other configurations, shapes, and formation methods of the LDD regions 700 are also possible and are fully intended to be included within the scope of the present disclosure. For example, the LDD regions 700 may be formed after gate spacer 702, which will be discussed below, are formed. In some embodiments, the LDD regions 700 are omitted.

Still referring to FIG. 7, after the LDD regions 700 are formed, in some embodiments, gate spacer 702 is formed around (e.g., along and contacting the sidewalls of) the dummy gate structures 600. For example, the gate spacer 702 may be formed on opposing sidewalls of the dummy gate structure 600. It should be understood that any number of gate spacers can be formed around the dummy gate structures 600 while remaining within the scope of the present disclosure.

The gate spacer 702 may be a low-k spacer and may be formed of a suitable dielectric material such as, for example, silicon oxide, silicon oxycarbonitride, silicon nitride, silicon oxynitride, silicon carbonitride, the like, or combinations thereof. Any suitable deposition method, such as thermal oxidation, chemical vapor deposition (CVD), or the like, may be used to form the gate spacer 702.

The shapes and formation methods of the gate spacer 702 as illustrated in FIG. 7 (and the following figures) are merely non-limiting examples, and other shapes and formation methods are possible. These and other variations are fully intended to be included within the scope of the present disclosure.

Figure 8:
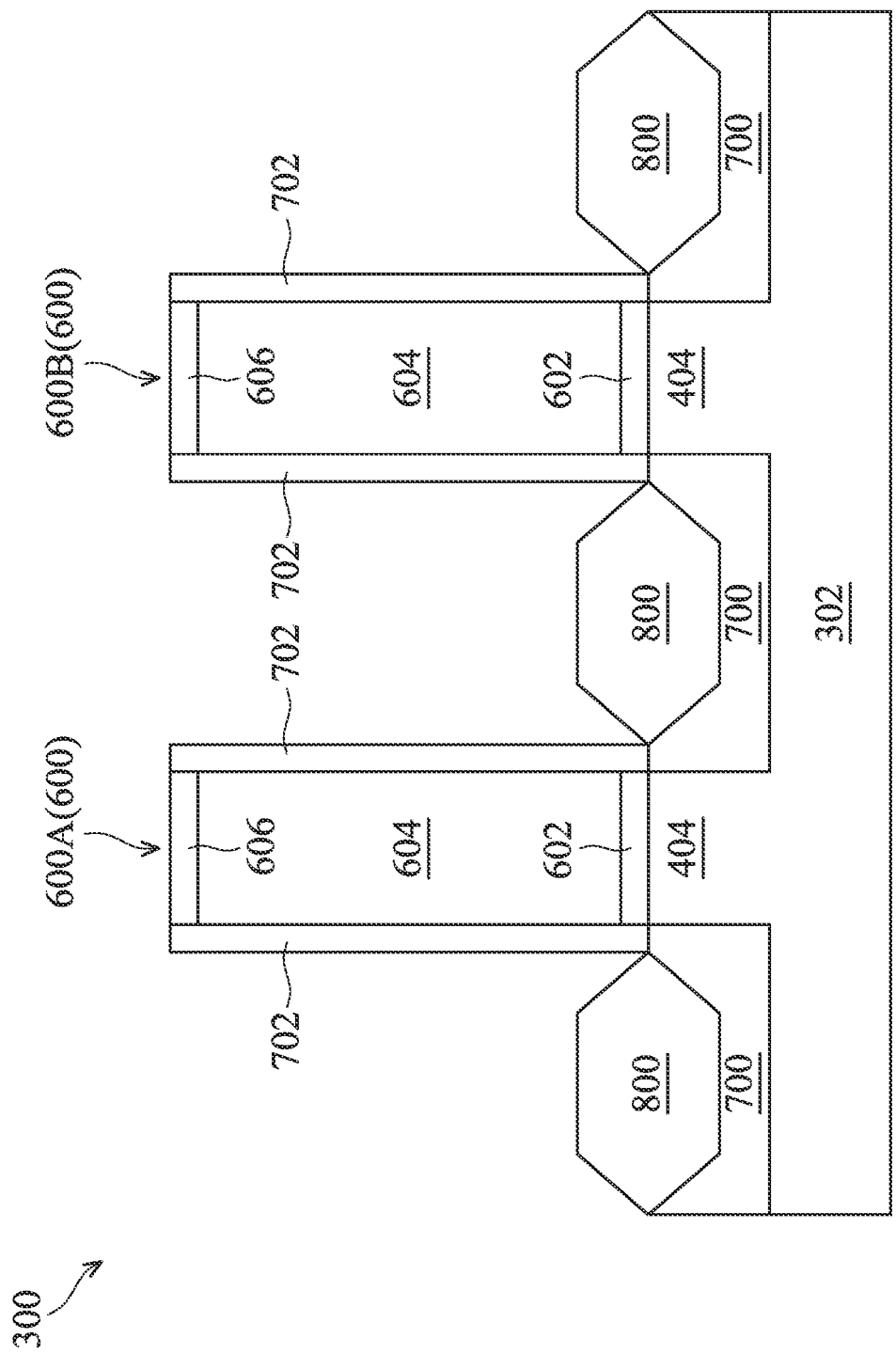

Corresponding to operation 212 of FIG. 2, FIG. 8 is a cross-sectional view of the FinFET device 300 including a number of source/drain regions 800 at one of the various stages of fabrication. The source/drain regions 800 are formed in recesses of the fin 404 adjacent to the dummy gate structures 600, e.g., between adjacent dummy gate structures 600 and/or next to a dummy gate structure 600. The recesses are formed by, e.g., an anisotropic etching process using the dummy gate structures 600 as an etching mask, in some embodiments, although any other suitable etching process may also be used.

The source/drain regions 800 are formed by epitaxially growing a semiconductor material in the recess, using suitable methods such as metal-organic CVD (MOCVD), molecular beam epitaxy (MBE), liquid phase epitaxy (LPE), vapor phase epitaxy (VPE), selective epitaxial growth (SEG), the like, or a combination thereof.

As illustrated in FIG. 8, the epitaxial source/drain regions 800 may have surfaces raised from respective surfaces of the fin 404 (e.g. raised above the non-recessed portions of the fin 404) and may have facets. In some embodiments, the source/drain regions 800 of the adjacent fins may merge to form a continuous epitaxial source/drain region (not shown). In some embodiments, the source/drain regions 800 of the adjacent fins may not merge together and remain separate source/drain regions 800 (not shown). In some embodiments, when the resulting FinFET device is an n-type FinFET, the source/drain regions 800 can include silicon carbide (SiC), silicon phosphorous (SiP), phosphorous-doped silicon carbon (SiCP), or the like. In some embodiments, when the resulting FinFET device is a p-type FinFET, the source/drain regions 800 comprise SiGe, and a p-type impurity such as boron or indium.

The epitaxial source/drain regions 800 may be implanted with dopants to form source/drain regions 800 followed by an annealing process. The implanting process may include forming and patterning masks such as a photoresist to cover the regions of the FinFET device 300 that are to be protected from the implanting process. The source/drain regions 800 may have an impurity (e.g., dopant) concentration in a range from about $1\times10^{19}$ cm$^{-3}$ to about $1\times10^{21}$ cm$^{-3}$. P-type impurities, such as boron or indium, may be implanted in the source/drain region 800 of a P-type transistor. N-type impurities, such as phosphorous or arsenide, may be implanted in the source/drain regions 800 of an N-type transistor. In some embodiments, the epitaxial source/drain regions 800 may be in situ doped during their growth.

Figure 9:
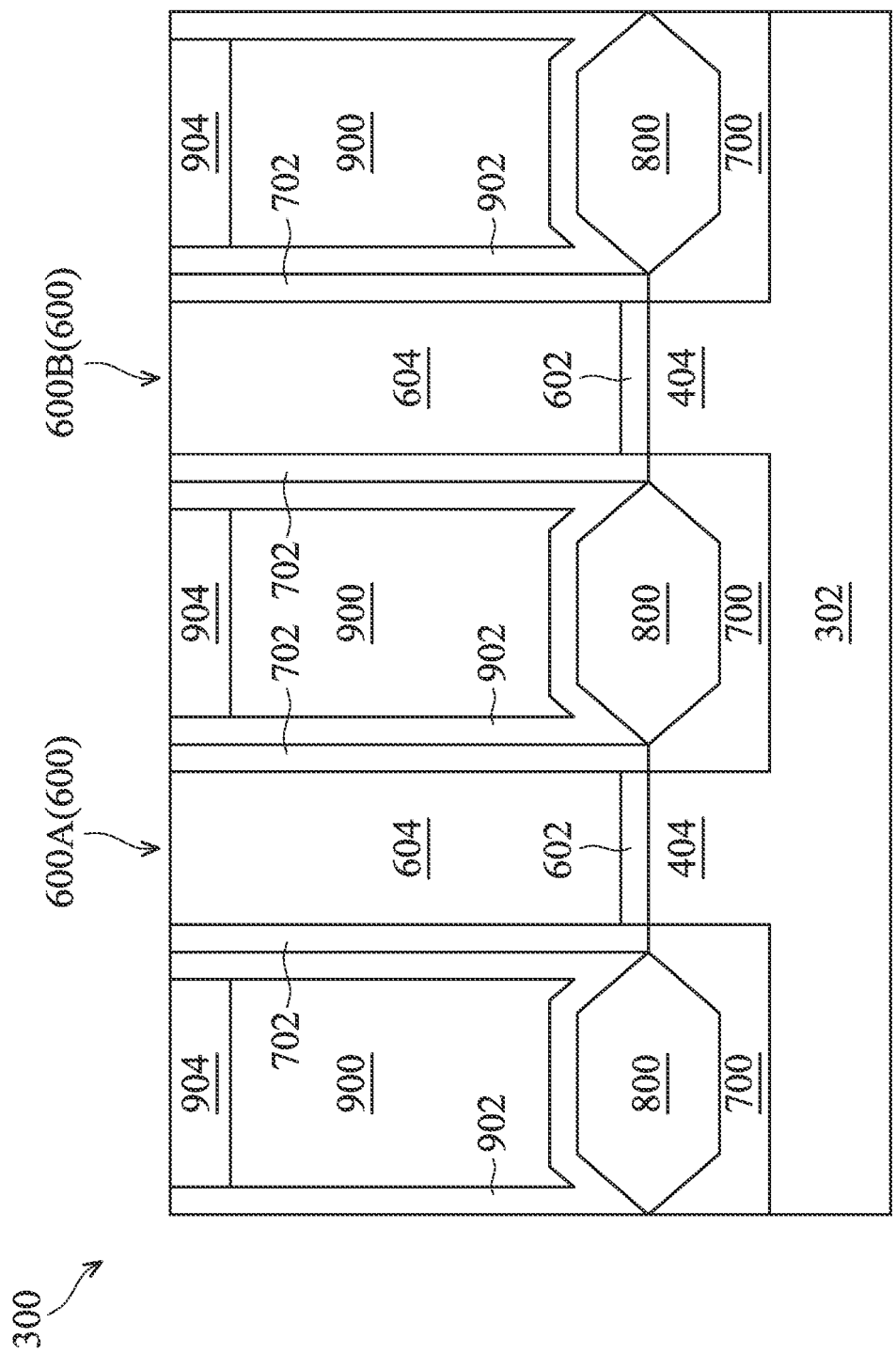

Corresponding to operation 214 of FIG. 2, FIG. 9 is a cross-sectional view of the FinFET device 300 including an interlayer dielectric (ILD) 900 at one of the various stages of fabrication. In some embodiments, prior to forming the ILD 900, a contact etch stop layer (CESL) 902 is formed over the structure illustrated in FIG. 9. The CESL 902 can function as an etch stop layer in a subsequent etching process, and may comprise a suitable material such as silicon oxide, silicon nitride, silicon oxynitride, combinations thereof, or the like, and may be formed by a suitable formation method such as CVD, PVD, combinations thereof, or the like.

Next, the ILD 900 is formed over the CESL 902 and over the dummy gate structures 600 (e.g., 600A and 600B). In some embodiments, the ILD 900 is formed of a dielectric material such as silicon oxide, phosphosilicate glass (PSG), borosilicate glass (BSG), boron-doped phosphosilicate Glass (BPSG), undoped silicate glass (USG), or the like, and may be deposited by any suitable method, such as CVD, PECVD, or FCVD. After the ILD 900 is formed, a dielectric layer 904 is formed over the ILD 900. The dielectric layer 904 can function as a protection layer to prevent or reduces the loss of the ILD 900 in subsequent etching processes. The dielectric layer 904 may be formed of a suitable material, such as silicon nitride, silicon carbonitride, or the like, using a suitable method such as CVD, PECVD, or FCVD. After the dielectric layer 904 is formed, a planarization process, such as a CMP process, may be performed to achieve a level top surface for the dielectric layer 904. The CMP may also remove the mask 606 (FIG. 8) and portions of the CESL 902 disposed over the dummy gate 604. After the planarization process, the top surface of the dielectric layer 904 is level with a top surface of the dummy gate 604, in some embodiments.

An example gate-last process (sometimes referred to as replacement gate process) is performed subsequently to replace the dummy gate 604 and the dummy gate dielectric 602 of each of the dummy gate structures 600 with an active gate structure (which may also be referred to as a replacement gate structure or a metal gate structure).

Figure 10:
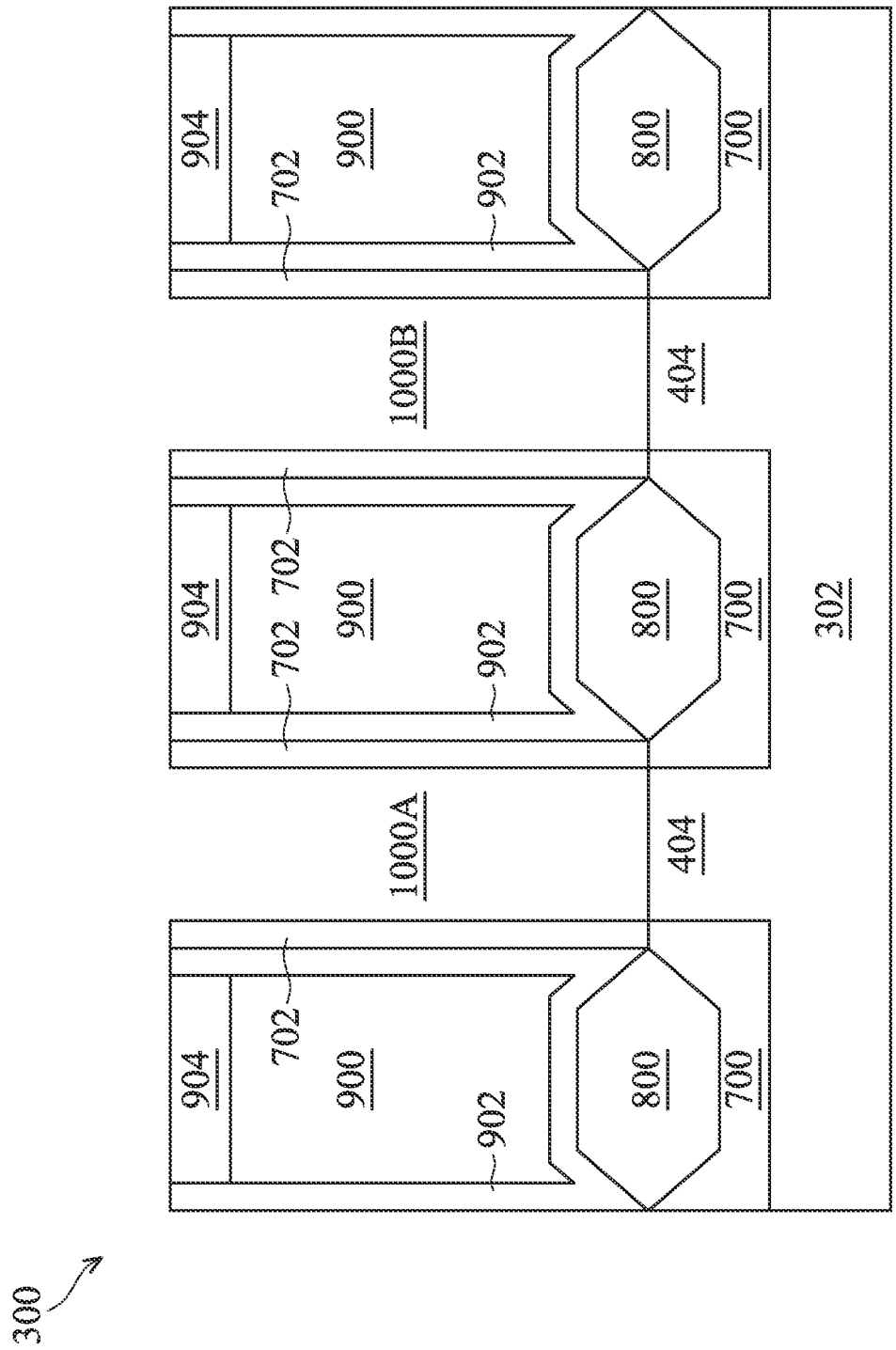

Corresponding to operation 216 of FIG. 2, FIG. 10 is a cross-sectional view of the FinFET device 300 in which the dummy gate structures 600A and 600C (FIG. 9) are removed to form gate trenches 1000A and 1000B, respectively, at one of the various stages of fabrication. For simplicity, the gate trenches 1000A-B may sometimes be collectively referred to as gate trenches 1000.

In some embodiments, to remove the dummy gate structures 600, one or more etching steps are performed to remove the dummy gate 604 and the dummy gate dielectric 602 directly under the dummy gate 604, so that the gate trenches 1000 (which may also be referred to as recesses) are formed between respective gate spacers 702. In other words, each of the gate trenches 1000 is surrounded by a respective gate spacer 702. Each gate trench 1000 exposes the channel region of the fin 404. During the dummy gate removal, the dummy gate dielectric 602 may be used as an etch stop layer when the dummy gate 604 is etched. The dummy gate dielectric 602 may then be removed after the removal of the dummy gate 604. In some embodiment, during the removal of the dummy gate 604 and/or dummy gate dielectric 602, the gate spacer 702 may remain intact.

Figure 11:
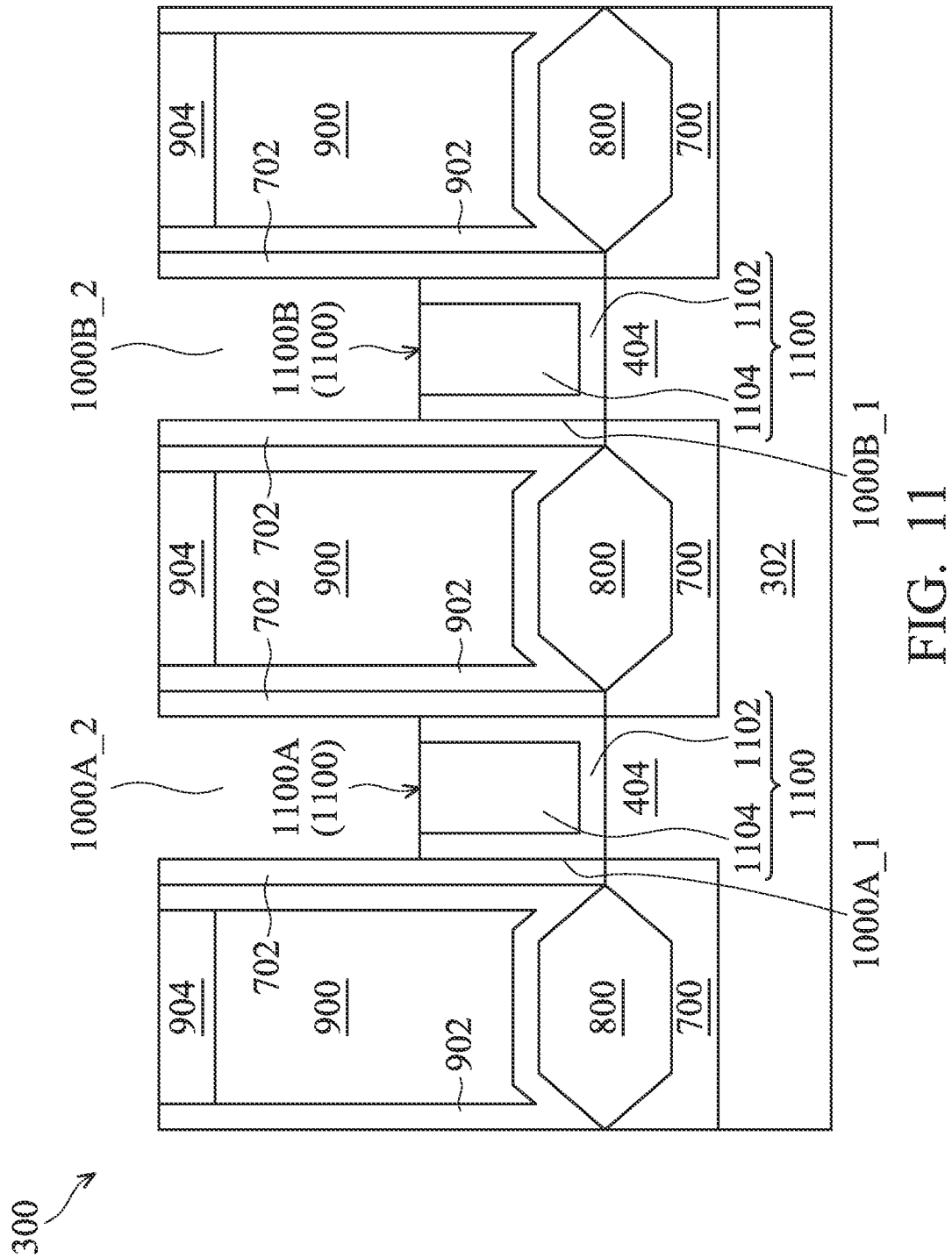

Corresponding to operation 218 of FIG. 2, FIG. 11 is a cross-sectional view of the FinFET device 300 including active gate structures 1100A and 1100B at one of the various stages of fabrication. In accordance with various embodiments, each of the active gate structures 1100A and 1100B is formed in the lower portion of a respective one of the gate trenches 1000. As shown, the active gate structure 1100A is formed in a lower portion of the gate trench 1000A; and the active gate structure 1100B is formed in a lower portion of the gate trench 1000B. As such, a first region of the gate trench 1000A (1000A_1) that is surrounded by a lower portion of the gate spacer 702 (on the left hand side) is filled with the active gate structure 1100A, and a second region of the gate trench 1000A (1000A_2) that is surrounded by an upper portion of the gate spacer 702 (on the left hand side) may remain exposed; and a first region of the gate trench 1000B (1000B_1) that is surrounded by a lower portion of the gate spacer 702 (on the right hand side) is filled with the active gate structure 1100B, and a second region of the gate trench 1000B (1000B_2) that is surrounded by an upper portion of the gate spacer 702 (on the right hand side) may remain exposed. For simplicity, the first regions of the gate trenches 1000A_1 and 1000B_1 may sometimes be collectively referred to as first regions 1000_1, the second regions of the gate trenches 1000A_2 and 1000B_2 may sometimes be collectively referred to as second regions 1000_2, and the active gate structures 1100A and 1100B may sometimes be collectively referred to as active gate structures 1100. In some embodiments, each of the active gate structures 1100 includes one or more gate dielectric layers (or gate dielectrics) 1102, one or more metal layers (or metal gates) 1104, an optional capping layer (not shown), and a glue layer (not shown).

For example, the gate dielectric layer 1102 is deposited conformally in the gate trench 1000, such as on the top surfaces and the sidewalls of the fin 404, on the top surfaces and the sidewalls of the gate spacer 702, and on the top surface of the dielectric layer 904. In accordance with some embodiments, the gate dielectric layer 1102 includes silicon oxide, silicon nitride, or multilayers thereof. In example embodiments, the gate dielectric layer 1102 includes a high-k dielectric material, and in these embodiments, the gate dielectric layers 1102 may have a k value greater than about 7.0, and may include a metal oxide or a silicate of Hf, Al, Zr, La, Mg, Ba, Ti, Pb, and combinations thereof. The formation methods of gate dielectric layer 1102 may include molecular beam deposition (MBD), atomic layer deposition (ALD), PECVD, and the like. A thickness of the gate dielectric layer 1102 may be between about 8 angstroms (Å) and about 20 angstroms, as an example.

The metal layer 1104 is formed (e.g., conformally) over the gate dielectric layer 1102. The metal layer 1104 may include a P-type work function layer, an N-type work function layer, multi-layers thereof, or combinations thereof, in some embodiments. In the discussion herein, a work function layer may also be referred to as a work function metal. Example P-type work function metals that may be included in the gate structures for P-type devices include TiN, TaN, Ru, Mo, Al, WN, $ZrSi_2$, $MoSi_2$, $TaSi_2$, $NiSi_2$, other suitable P-type work function materials, or combinations thereof. Example N-type work function metals that may be included in the gate structures for N-type devices include Ti, Ag, TaAl, TaAlC, TiAlN, TaC, TaCN, TaSiN, Mn, Zr, other suitable N-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), ALD, and/or other suitable process. A thickness of a P-type work function layer may be between about 8 Å and about 15 Å, and a thickness of an N-type work function layer may be between about 15 Å and about 30 Å, as an example.

The optional capping layer is formed (e.g., conformally) over the metal layer 1104. The capping layer, if formed, protects the underlying metal layer 1104 from being oxidized. In some embodiments, the capping layer is a silicon-containing layer, such as a layer of silicon, a layer of silicon oxide, or a layer of silicon nitride formed by a suitable method such as ALD, MBD, CVD, or the like. A thickness of the capping layer may be between about 8 Å and about 15 Å.

The glue layer is formed (e.g., conformally) over the capping layer, or over the metal layer 1104 if the capping layer is omitted. The glue layer functions as an adhesion layer between the underlying layer and a subsequently formed gate electrode material over the glue layer. The glue layer may be formed of a suitable material, such as titanium nitride, using a suitable deposition method such as CVD, PVD, ALD, or the like.

Figure 12:
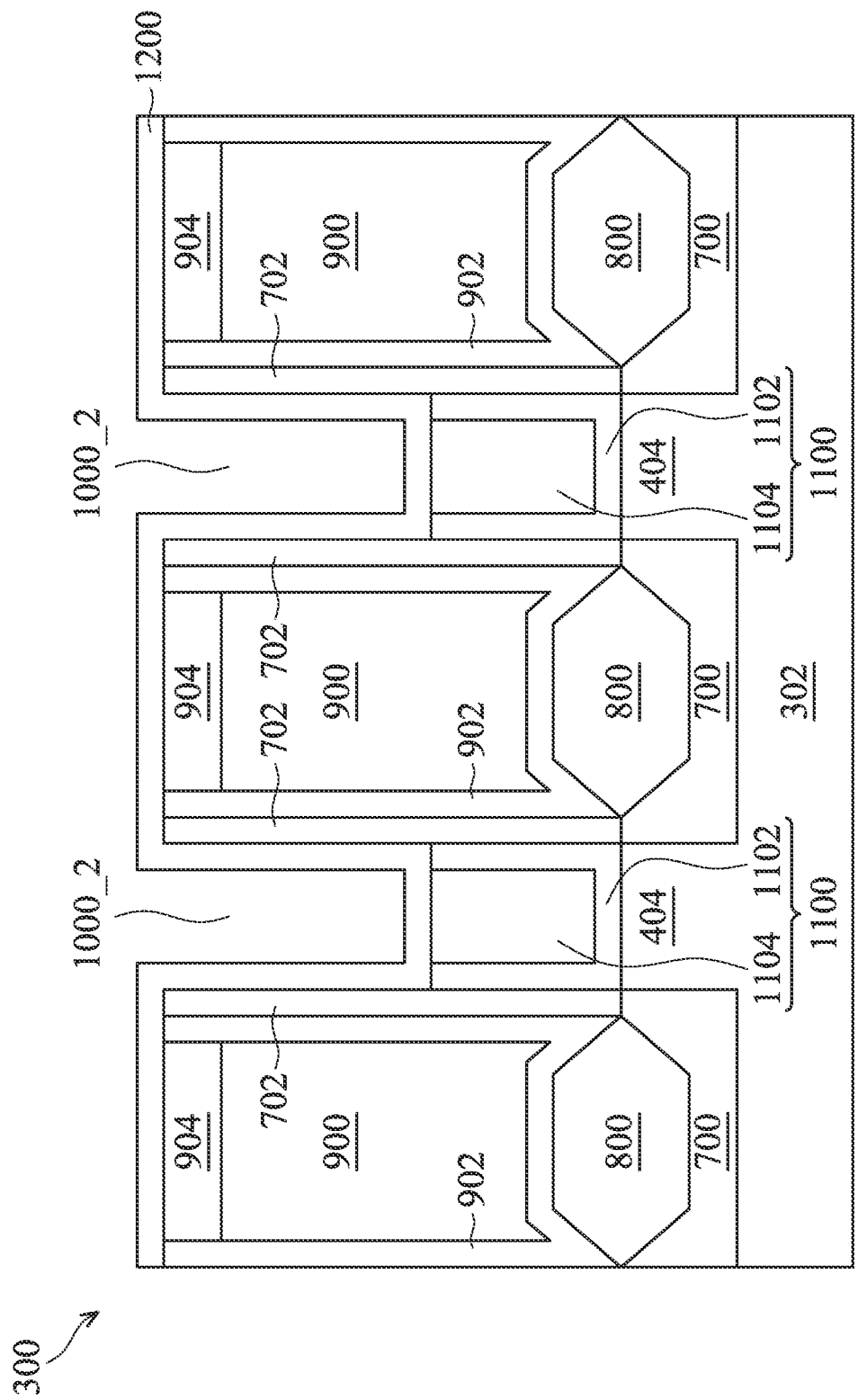

Corresponding to operation 220 of FIG. 2, FIG. 12 is a cross-sectional view of the FinFET device 300 including a blanket dielectric 1200 at one of the various stages of fabrication. In some embodiments, the blanket dielectric 1200 is conformally formed over the FinFET device 300. As shown, the blanket dielectric 1200 overlays the top surface of the dielectric layer 904, extends along inner sidewalls of the gate spacers 702 (that are not filled by the active gate structures 1100), and overlays a top surface of the active gate structures 1100. In other words, by forming the blanket dielectric 1200 as a conformal layer with a substantially thin thickness (e.g., about 1-20 nanometers (nm)), such a conformal layer, which lines in the second region of the gate trench 1000_2, can extend along the upper portion of the inner sidewalls of the gate spacers 702 and overlay the top surface of the active gate structure 1100.

The blanket dielectric 1200 may include a material selected from the group consisting of silicon oxide, silicon nitride, silicon carbide, silicon oxycarbide, silicon oxynitride, silicon carbonitride, silicon oxycarbonitride, and combinations thereof. In some embodiments, the blanket dielectric 1200 and the gate spacer 702 may have different materials to provide etching selectivity in subsequent processes. The blanket dielectric 1200 may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. In some other embodiments, the blanket dielectric 1200 may include a high-k dielectric material. As such, the blanket dielectric 1200 may have a k value greater than about 4.0 or even greater than about 7.0, and may include a metal oxide or a silicate of Hf, Al, Zr, La, Mg, Ba, Ti, Pb, and combinations thereof. The formation methods of such a high-k blanket dielectric 1200 may include molecular beam deposition (MBD), atomic layer deposition (ALD), PECVD, and the like.

Figure 13:
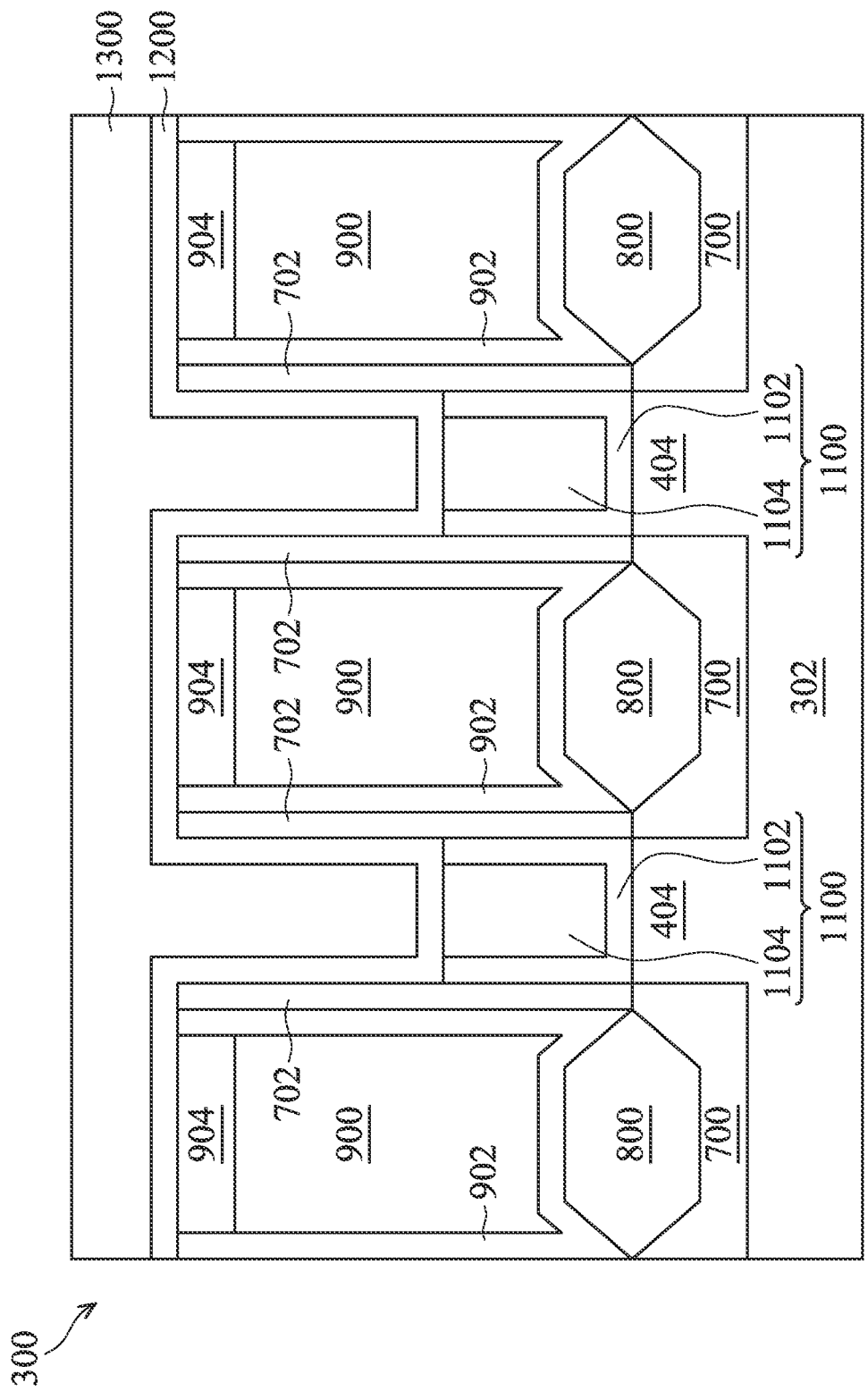

Corresponding to operation 222 of FIG. 2, FIG. 13 is a cross-sectional view of the FinFET device 300 including a sacrificial layer 1300 at one of the various stages of fabrication. As shown, the sacrificial layer 1300 can be deposited over the FinFET device 300 to fill the rest of the gate trenches 1000 (e.g., the second regions 1000_2). The sacrificial layer 1300 may be used to define or otherwise control the height of a dielectric protection layer subsequently formed out of the blanket dielectric 1200, and then be removed, which will be discussed below.

In some embodiments, the sacrificial layer 1300 includes a polymer-based dielectric, and is deposited by spin coating to fill the second regions of the gate trenches 1000_2. The polymer-based dielectric can be an inorganic polymer such as a silicon-based polymer like SOG (spin-on glass). The polymer-based dielectric can be an organic polymer such as a silicon-based polymer with higher organic contents, an aromatic hydrocarbon, poly (arylene ether) (PAE) films, benzocyclobutene (BCB) based films, polyimides or fluorinated polyimides, amorphous fluorinated carbon films, polytetrafluoroethylene (PTFE) films, or parylene. For example, one type of the organic polymer-based dielectric is FLARE™, manufactured by Allied Signal of U.S.A., and is synthesized from perfluorobiphenyl with aromatic bisphenols, which results in a fluorine-doped polymer. Upon being deposited (e.g., by spin coating), the sacrificial layer 1300 is then cured at a temperature of between about 350° C. and 420° C. for about 20 to 60 minutes.

Figure 14:
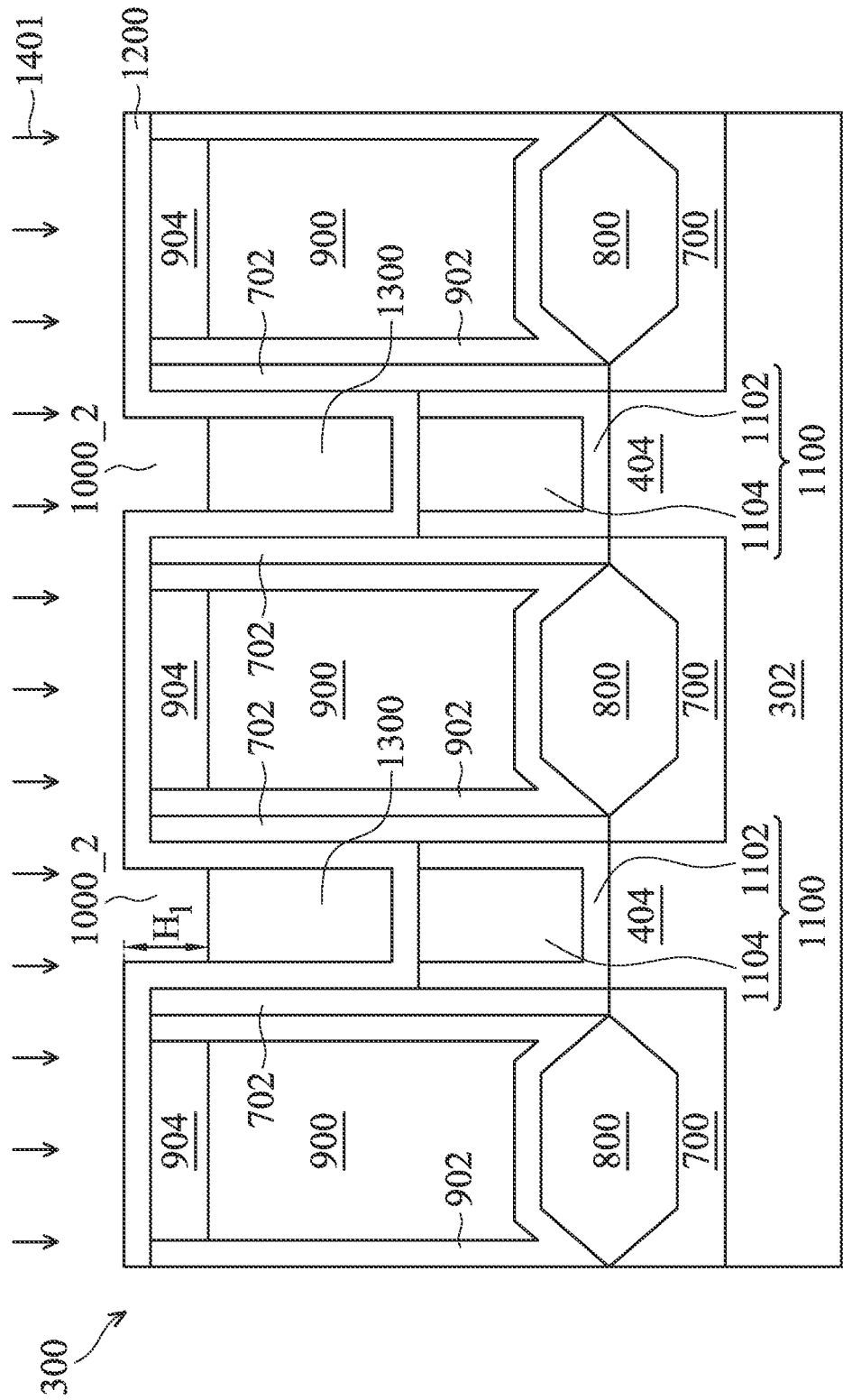

Corresponding to operation 224 of FIG. 2, FIG. 14 is a cross-sectional view of the FinFET device 300 in which portions of the sacrificial layer 1300 are removed at one of the various stages of fabrication. In some embodiments, the portions of the sacrificial layer 1300 include the portions that are over the dielectric layer 904 and recessed into the second regions of gate trenches 1000_2. The portions of the sacrificial layer 1300 may be removed by one or more etching processes 1401, thereby causing portions of the blanket dielectric 1200 to be exposed.

As shown in the example of FIG. 14, the exposed portions of the blanket dielectric 1200 may include the portions of the blanket dielectric 1200 overlaying the dielectric layer 904 and extending into the second regions of the gate trenches 1000_2 by a depth, Hi. Accordingly, the etching processes 1401 can cause the remaining portion of the sacrificial layer 1300 to be recessed into the second regions of the gate trenches 1000_2 by the depth, Hi, while leaving the exposed portions of the blanket dielectric 1200 intact. Such a recessed sacrificial layer 1300 may be used to control the height of a dielectric protection layer (formed by the blanket dielectric 1200), which will be discussed in further detail below.

The etching processes 1401 may be anisotropic. For example, the etching processes 1401 may be carried out using anisotropic plasma etching in a high-density plasma (HDP) etcher, with an etchant gas such as carbon tetrafluoride ($CF_4$), trifluoromethane ($CHF_3$), methylfluoride ($CH_3F$) and nitrogen ($N_2$). Operation conditions of the etching processes 1401 may be selected to have a higher etching rate on the material of the sacrificial layer 1300 than the material of the blanket dielectric 1200.

Figure 15:
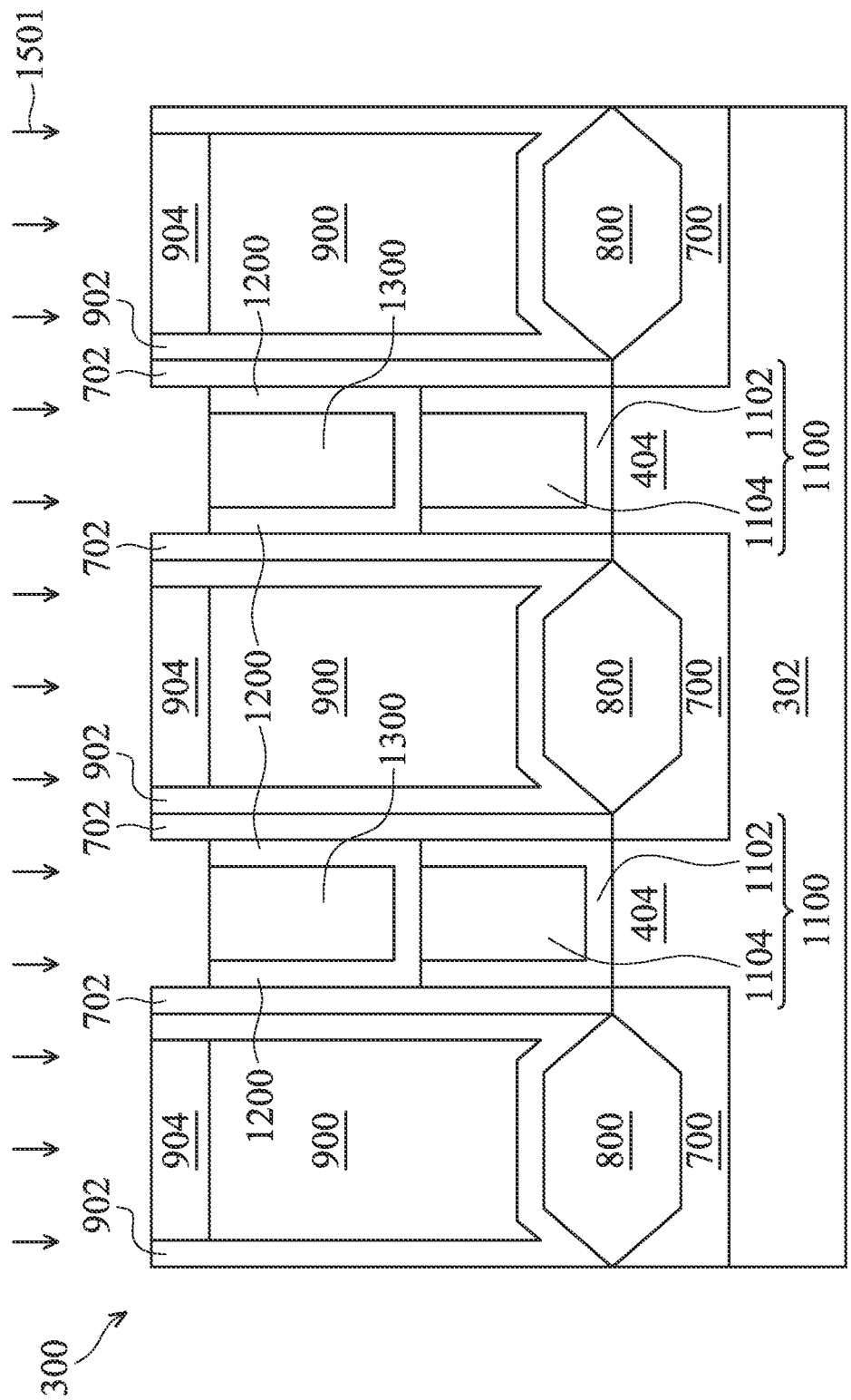

Corresponding to operation 226 of FIG. 2, FIG. 15 is a cross-sectional view of the FinFET device 300 in which the exposed portions of the blanket dielectric 1200 are removed at one of the various stages of fabrication. In some embodiments, the exposed portions of the blanket dielectric 1200, which are defined by the recessed sacrificial layer 1300, are removed by performing one or more etching processes 1501. The etching processes 1501 may be isotropic. For example, the etching processes 1501 may be carried out by applying wet etchants over the FinFET device 300. The wet etchants can include diluted hydrofluoric acid (DHF), and/or an amine derivative etchant (e.g., $NH_4OH$, $NH_3(CH_3)OH$, TetraMethyl Ammonium Hydroxide (TMAH), etc.). In some embodiments, the etchants may be placed within a solvent (e.g., ethylene glycol (EG), diethylene glycol (DEG), 1-(2-hydroxyethyl)-2-pyrrolidinone (HEP), dimethyl sulfoxide (DMSO), sulfolane, combinations of these, or the like) to a concentration of between about 1%-volume and about 10%-volume. During the etching process, the wet etchants 1501 may be kept at a temperature of between about 30° C. and about 65° C., such as about 50° C., for a time of between about 30 seconds and about 300 seconds, such as about 150 seconds.

Figure 16:
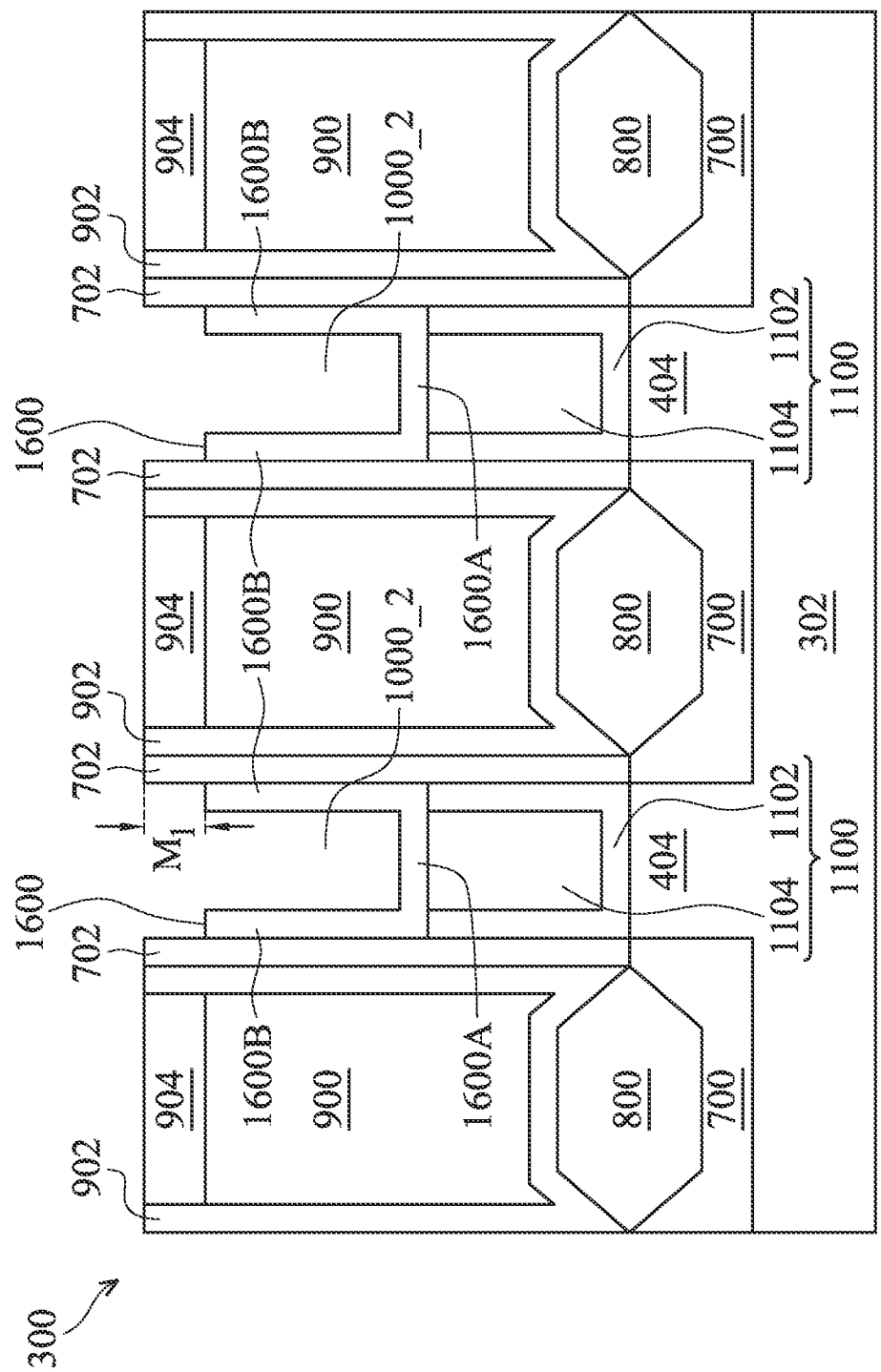

Corresponding to operation 228 of FIG. 2, FIG. 16 is a cross-sectional view of the FinFET device 300 in which the remaining portions of the sacrificial layer 1300 are removed at one of the various stages of fabrication. Upon the remaining portions of the sacrificial layer 1300 being removed, dielectric protection layers (sometimes referred to as dielectric helmet layers) 1600 can be formed. As shown, each of the dielectric protection layers 1600, formed in the second region of the gate trench 1000_2, has a U-shaped cross-section. For example, the dielectric protection layer 1600 has a first portion 1600A lining or otherwise overlaying (e.g., in physical contact with) a top surface of the active gate structure 1000 and a second portion 1600B, connected to both ends of the first portion 1600A, that extends along the sidewalls of the second region 1000_2 (or the upper portions of the inner sidewalls of the gate spacer 702).

In the example of FIG. 16, the second portion of the dielectric protection layer 1600B is recessed with respect to the top surface of the gate spacer 702 by the depth, Mi. This may be beneficial in the subsequent process where a planarizing process occurs. For example, one or more CMP processes may be performed during the formation of contacts. As such, the recessed second portion 1600B (relative to the gate spacer 702) may be used as a stop layer to end the CMP processes. However, it is appreciated that the second portion of the dielectric protection layer 1600B can be leveled with the top surface of the gate spacer 702, while remaining within the scope of the present disclosure.

Figure 17:
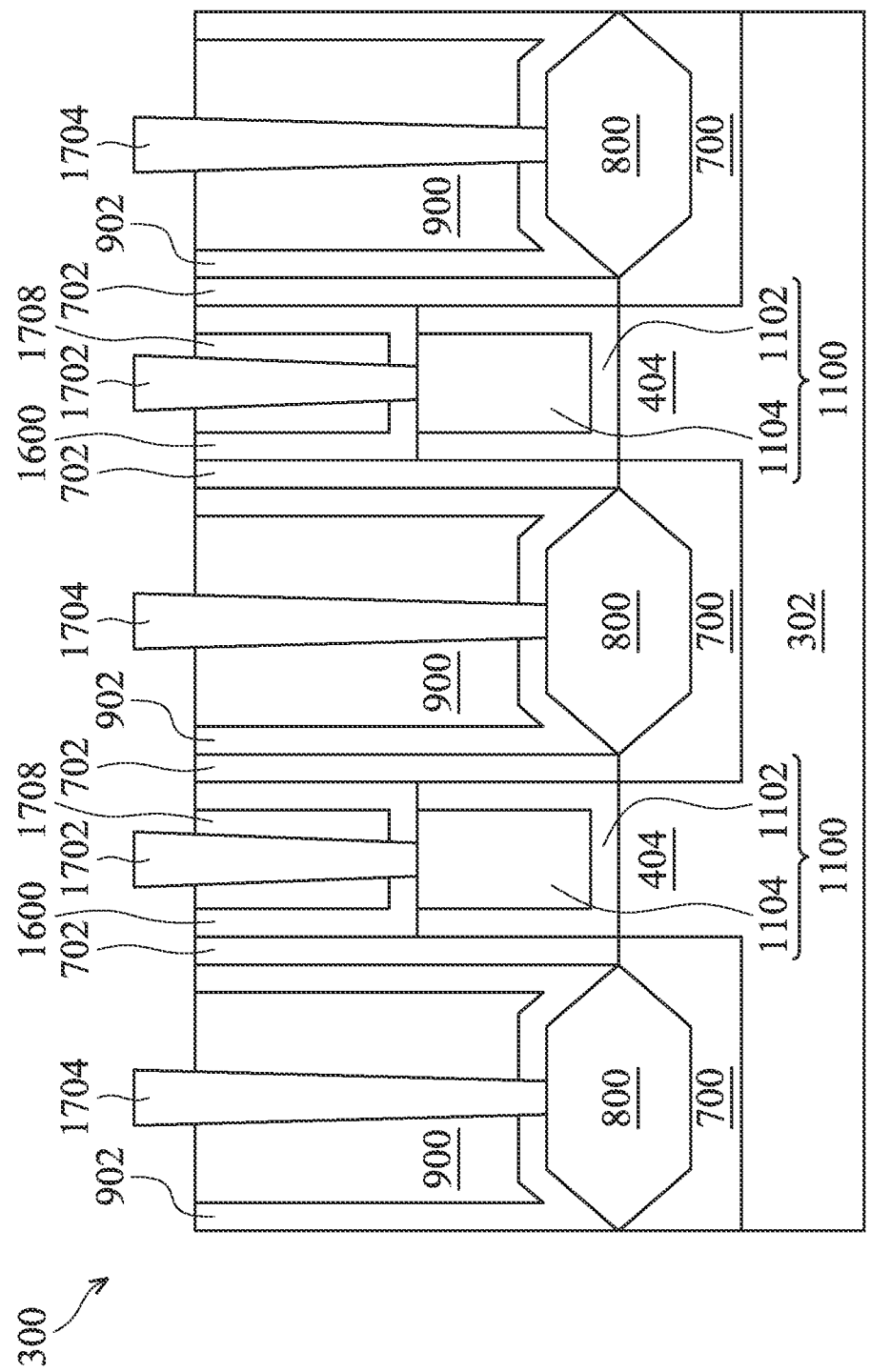

Corresponding to operation 230 of FIG. 2, FIG. 17 is a cross-sectional view of the FinFET device 300 including contacts 1702 and 1704 at one of the various stages of fabrication. Each of the contact 1702 and 1704 may include a via structure penetrating through one or more dielectrics to electrically connect to a device structure, region, or feature. For example, the contact 1702 penetrates a dielectric 1708 and the dielectric protection layer 1600 to electrically connect to the active gate structure 1100 (specifically, the metal gate 1104); and the contact 1704 penetrates the ILD 900 and the ESL 902 to electrically connect to source/drain region 800. Accordingly, the contact 1702 and contact 1704 may sometimes be referred to as a gate contact and source/drain contact, respectively.

By forming the dielectric protection layer 1600 around the gate contact 1702, the gate contact 1702 can be better isolated from adjacent contacts, e.g., source/drain contacts 1704. Thus, even though the ILD 900 between the gate contact 1702 and each of the adjacent source/drain contacts 1704 becomes thinner or inadvertently penetrated (by a conductive material, e.g., when forming the contacts 1702 and/or 1704), the dielectric protection layer 1600 can assure that the gate contact 1702 and each of the adjacent source/drain contacts 1704 stay electrically separated from each other, as they should be.

In some embodiments, the dielectric 1708 includes a similar material as the material of the ILD 900. For example, the dielectric 1708 includes a material selected from silicon oxide, phosphosilicate glass (PSG), borosilicate glass (BSG), boron-doped phosphosilicate Glass (BPSG), undoped silicate glass (USG), or the like. Thus, the dielectric 1708 is sometimes referred to as an ILD as well. The dielectric 1708 may be formed by depositing the above-described material(s) to fill the gate trenches 1000 (specifically, the second regions 1000_2) using any suitable method, such as CVD, PECVD, or FCVD. After filling the gate trenches 1100 with the dielectric 1708, one or more CMP processes may be performed to planarize the ILD 900 and the dielectric 1708. During the CMP processes, the dielectric layer 904 may be removed. Next, one or more patterning processes may be performed to form respective openings extending through the ILD 900/dielectric 1708 so as to expose the metal gate 1104 and source/drain regions 800. The openings are then filled with a conductive material (e.g., copper, tungsten, or the like) to form the contacts 1702 and 1704. In some embodiments, each of the contacts 1702 and 1704 may be surrounded by a (diffusion) barrier layer, which is not shown for clarity of illustration. The barrier layer can include a material selected from a group consisting of: tantalum (Ta), tantalum nitride (TaN), titanium nitride (TiN), titanium tungsten (TiW), and titanium (Ti).

In one aspect of the present disclosure, a semiconductor device is disclosed. The semiconductor device includes a semiconductor fin. The semiconductor device includes a gate spacer over the semiconductor fin. A lower portion of the gate spacer surrounds a first region and an upper portion of the gate spacer surrounds a second region. The semiconductor device includes a gate dielectric within the first region. The semiconductor device includes a metal gate within the first region. The semiconductor device includes a dielectric protection layer, in contact with the gate dielectric layer, that includes a first portion within the second region and a second portion lining a top surface of the metal gate.

In another aspect of the present disclosure, a semiconductor device is disclosed. The semiconductor device includes a semiconductor fin. The semiconductor device includes a metal gate over the semiconductor fin. The semiconductor device includes a gate spacer over the semiconductor fin and extending along a sidewall of the metal gate. The gate spacer includes a lower portion and an upper portion over the lower portion, where the sidewall of the metal gate is adjacent the lower portion. The semiconductor device further includes a dielectric protection layer having a sidewall adjacent the upper portion of the gate spacer and a bottom surface contacting a top surface of the metal gate.

In yet another aspect of the present disclosure, a semiconductor device is disclosed. The semiconductor device includes a semiconductor fin. The semiconductor device includes a gate spacer over the semiconductor fin. The gate spacer includes a lower portion and an upper portion over the lower portion. The semiconductor device includes a gate dielectric over the semiconductor fin. The semiconductor device includes a metal gate over the gate dielectric and adjacent the lower portion of the gate spacer. A top surface of the gate spacer is above a top surface of each of the metal gate and the gate dielectric. The semiconductor device further includes a dielectric protection layer over the metal gate. The dielectric protection layer includes a sidewall portion extending along the upper portion of the gate spacer and a bottom portion contacting the top surface of each of the metal gate and the gate dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a semiconductor fin;
    a gate spacer over the semiconductor fin, wherein a lower portion of the gate spacer surrounds a first region and an upper portion of the gate spacer surrounds a second region;
    a gate dielectric within the first region;
    a metal gate within the first region;
    a source/drain feature in the semiconductor fin adjacent to the metal gate;

an etch-stop layer overlaying the source/drain feature, a portion of the etch-stop layer laterally extending between a sidewall of the source/drain feature and the gate spacer;
a dielectric protection layer in contact with the gate dielectric, the dielectric protection layer including a first portion within the second region and a second portion lining a top surface of the metal gate;
a first dielectric layer over the dielectric protection layer;
a second dielectric layer adjacent the gate spacer, wherein top surfaces of the first dielectric layer, the second dielectric layer, and the dielectric protection layer are coplanar; and
a source/drain contact embedded in the second dielectric layer, wherein a portion of the second dielectric layer laterally separates the source/drain contact from the gate spacer.

2. The semiconductor device of claim 1, wherein the gate dielectric includes at least one high-k dielectric material and the dielectric protection layer includes the same high-k dielectric material as the gate dielectric.

3. The semiconductor device of claim 1, wherein the dielectric protection layer includes a material selected from the group consisting of a silicate of Hf, Al, Zr, La, Mg, Ba, Ti, Pb, or combinations thereof.

4. The semiconductor device of claim 1, wherein the dielectric protection layer includes a material selected from the group consisting of silicon oxide, silicon nitride, silicon oxynitride, silicon carbonitride, and combinations thereof.

5. The semiconductor device of claim 1, further comprising a gate contact extending through the second portion of the dielectric protection layer to electrically connect to the metal gate.

6. The semiconductor device of claim 5, wherein the gate contact is electrically isolated from the source/drain contact by at least the first portion of the dielectric protection layer.

7. A semiconductor device, comprising:
a semiconductor fin;
a lightly doped drain region in the semiconductor fin;
a metal gate over the semiconductor fin;
a gate spacer over the semiconductor fin and extending along a sidewall of the metal gate, wherein the gate spacer includes a lower portion and an upper portion over the lower portion, and wherein the sidewall of the metal gate is adjacent the lower portion;
a source/drain feature in the lightly doped drain region, wherein the gate spacer is vertically aligned with a sidewall of the lightly doped drain region;
a dielectric protection layer having a sidewall adjacent to the upper portion of the gate spacer and a bottom surface contacting a top surface of the metal gate, the dielectric protection layer including a metal silicate material; and
a dielectric layer fully embedded in the dielectric protection layer, such that top surfaces of the dielectric protection layer and the dielectric layer are coplanar, the dielectric layer including a low-k dielectric material.

8. The semiconductor device of claim 7, further comprising a gate dielectric layer between the metal gate and the gate spacer, wherein the bottom surface of the dielectric protection layer contacts a top surface of the gate dielectric layer.

9. The semiconductor device of claim 8, wherein the dielectric protection layer and the gate dielectric layer include the same dielectric material.

10. The semiconductor device of claim 8, wherein the sidewall of the dielectric protection layer and a sidewall of the gate dielectric layer both directly contact the gate spacer.

11. The semiconductor device of claim 8, wherein the gate dielectric layer includes a high-k metal oxide material.

12. The semiconductor device of claim 7, wherein the dielectric layer includes silicon oxide.

13. The semiconductor device of claim 7, further comprising a gate contact over the metal gate, wherein the gate contact extends through the bottom surface of the dielectric protection layer to directly contact the metal gate.

14. The semiconductor device of claim 7, further comprising:
an interlayer dielectric layer adjacent the dielectric protection layer; and
a source/drain contact embedded in the interlayer dielectric layer, wherein the source/drain contact is separated from the dielectric protection layer by a portion of the interlayer dielectric layer.

15. A semiconductor device, comprising:
a semiconductor fin;
a gate spacer over the semiconductor fin, wherein the gate spacer includes an upper portion over a lower portion;
a gate dielectric over the semiconductor fin;
a metal gate over the gate dielectric and adjacent the lower portion of the gate spacer, wherein a top surface of the gate spacer is above a top surface of each of the metal gate and the gate dielectric;
a source/drain feature in the semiconductor fin adjacent to the metal gate;
an etch-stop layer over the source/drain feature, a portion of the etch-stop layer directly contacting both a sidewall of the gate spacer and a sidewall of the source/drain feature;
a dielectric protection layer over the metal gate, wherein the dielectric protection layer includes a sidewall portion extending along the upper portion of the gate spacer and a bottom portion extending across the top surface of each of the metal gate and the gate dielectric, and wherein the dielectric protection layer includes a metal silicate;
an interlayer dielectric (ILD) layer adjacent the gate spacer, wherein top surfaces of the ILD layer and the dielectric protection layer are leveled; and
a source/drain contact embedded in the ILD layer, a portion of the ILD layer laterally separating the source/drain contact from the gate spacer.

16. The semiconductor device of claim 15, wherein the gate dielectric and the dielectric protection layer both directly contact the gate spacer.

17. The semiconductor device of claim 15, wherein the gate dielectric and the dielectric protection layer have the same composition, and wherein the gate spacer and the dielectric protection layer have different compositions.

18. The semiconductor device of claim 15, wherein the top surface of the dielectric protection layer is leveled with a top surface of the gate spacer.

19. The semiconductor device of claim 15, further comprising a gate contact electrically connected to the metal gate, wherein the gate contact extends through the bottom portion of the dielectric protection layer to directly contact the metal gate.

20. The semiconductor device of claim 19, wherein the gate contact is electrically isolated from the source/drain contact by at least the sidewall portion of the dielectric protection layer.

* * * * *